United States Patent
Sugimae et al.

(10) Patent No.: US 10,410,717 B2
(45) Date of Patent: Sep. 10, 2019

(54) RESISTIVE RANDOM ACCESS MEMORY DEVICE WITH THREE-DIMENSIONAL CROSS-POINT STRUCTURE AND METHOD OF OPERATING THE SAME

(71) Applicant: TOSHIBA MEMORY CORPORATION, Tokyo (JP)

(72) Inventors: Kikuko Sugimae, Mie (JP); Yusuke Arayashiki, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 19 days.

(21) Appl. No.: 15/265,067

(22) Filed: Sep. 14, 2016

(65) Prior Publication Data

US 2017/0256312 A1    Sep. 7, 2017

Related U.S. Application Data

(60) Provisional application No. 62/304,601, filed on Mar. 7, 2016.

(51) Int. Cl.
  *G11C 13/00* (2006.01)
  *H01L 27/24* (2006.01)
  *H01L 45/00* (2006.01)

(52) U.S. Cl.
  CPC ........ *G11C 13/0026* (2013.01); *G11C 13/004* (2013.01); *G11C 13/0028* (2013.01); *G11C 13/0069* (2013.01); *G11C 13/0097* (2013.01); *H01L 27/2481* (2013.01); *H01L 45/085* (2013.01); *H01L 45/1233* (2013.01); *H01L 45/1266* (2013.01); *H01L 45/145* (2013.01); *H01L 45/146* (2013.01); *H01L 45/1675* (2013.01); *G11C 2013/0045* (2013.01); *G11C 2013/0078* (2013.01); *G11C 2213/11* (2013.01); *G11C 2213/31* (2013.01);
  (Continued)

(58) Field of Classification Search
  CPC .............. G11C 13/0026; G11C 13/004; G11C 13/0069; G11C 13/0097; H01L 27/2481; H01L 45/085; H01L 45/1233; H01L 45/1266
  See application file for complete search history.

(56) References Cited

U.S. PATENT DOCUMENTS 6,845,030 B2    1/2005    Kang et al.
8,964,447 B2    2/2015    Nagashima et al.
(Continued)

*Primary Examiner* — Mushfique Siddique
(74) *Attorney, Agent, or Firm* — Foley & Lardner LLP

(57) ABSTRACT

A memory device according to an embodiment includes a first interconnect, a second interconnect, a first variable resistance member, a third interconnect, a second variable resistance member, a fourth interconnect, a fifth interconnect and a third variable resistance member. The first interconnect, the third interconnect and the fourth interconnect extend in a first direction. The second interconnect and the fifth interconnect extend in a second direction crossing the first direction. The first variable resistance member is connected between the first interconnect and the second interconnect. The second variable resistance member is connected between the second interconnect and the third interconnect. The third variable resistance member is connected between the fourth interconnect and the fifth interconnect. The fourth interconnect is insulated from the third interconnect.

22 Claims, 17 Drawing Sheets

(52) U.S. Cl.
CPC ...... *G11C 2213/32* (2013.01); *G11C 2213/33* (2013.01); *G11C 2213/34* (2013.01); *G11C 2213/71* (2013.01); *H01L 45/147* (2013.01)

(56) References Cited

U.S. PATENT DOCUMENTS

| | | | | |
|---|---|---|---|---|
| 9,397,140 B2* | 7/2016 | Kuniya | | H01L 45/04 |
| 2009/0001344 A1* | 1/2009 | Schricker | | H01L 45/146 |
| | | | | 257/4 |
| 2011/0049465 A1* | 3/2011 | Nagashima | | H01L 27/0207 |
| | | | | 257/5 |
| 2011/0244666 A1 | 10/2011 | Kim et al. | | |
| 2011/0299340 A1* | 12/2011 | Samachisa | | G11C 16/06 |
| | | | | 365/185.21 |
| 2012/0063194 A1* | 3/2012 | Baek | | G11C 5/025 |
| | | | | 365/148 |
| 2013/0228736 A1* | 9/2013 | Matsushita | | H01L 45/085 |
| | | | | 257/4 |
| 2014/0009997 A1* | 1/2014 | Toda | | G11C 13/0023 |
| | | | | 365/148 |
| 2014/0119098 A1* | 5/2014 | Toda | | G11C 13/0011 |
| | | | | 365/148 |
| 2014/0264225 A1* | 9/2014 | Arayashiki | | H01L 45/085 |
| | | | | 257/2 |
| 2014/0355326 A1* | 12/2014 | Okawa | | G11C 13/0002 |
| | | | | 365/63 |
| 2015/0037931 A1* | 2/2015 | Kuniya | | H01L 45/04 |
| | | | | 438/104 |
| 2015/0236072 A1* | 8/2015 | Tanaka | | H01L 27/2436 |
| | | | | 257/4 |
| 2016/0019951 A1* | 1/2016 | Park | | G11C 13/0069 |
| | | | | 365/148 |
| 2016/0064661 A1* | 3/2016 | Kawashima | | H01L 45/1233 |
| | | | | 257/4 |
| 2016/0072060 A1* | 3/2016 | Sugimae | | H01L 27/2481 |
| | | | | 257/5 |

* cited by examiner

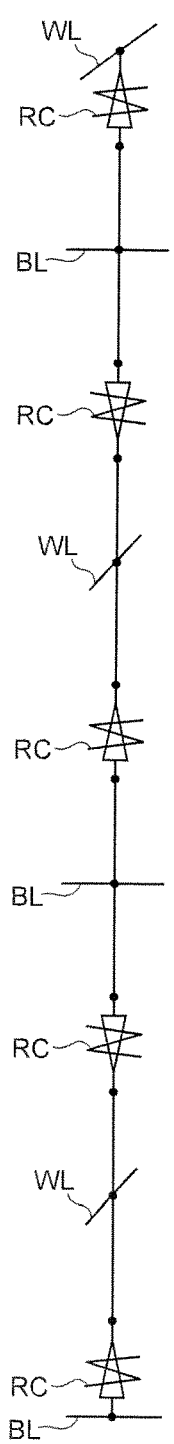
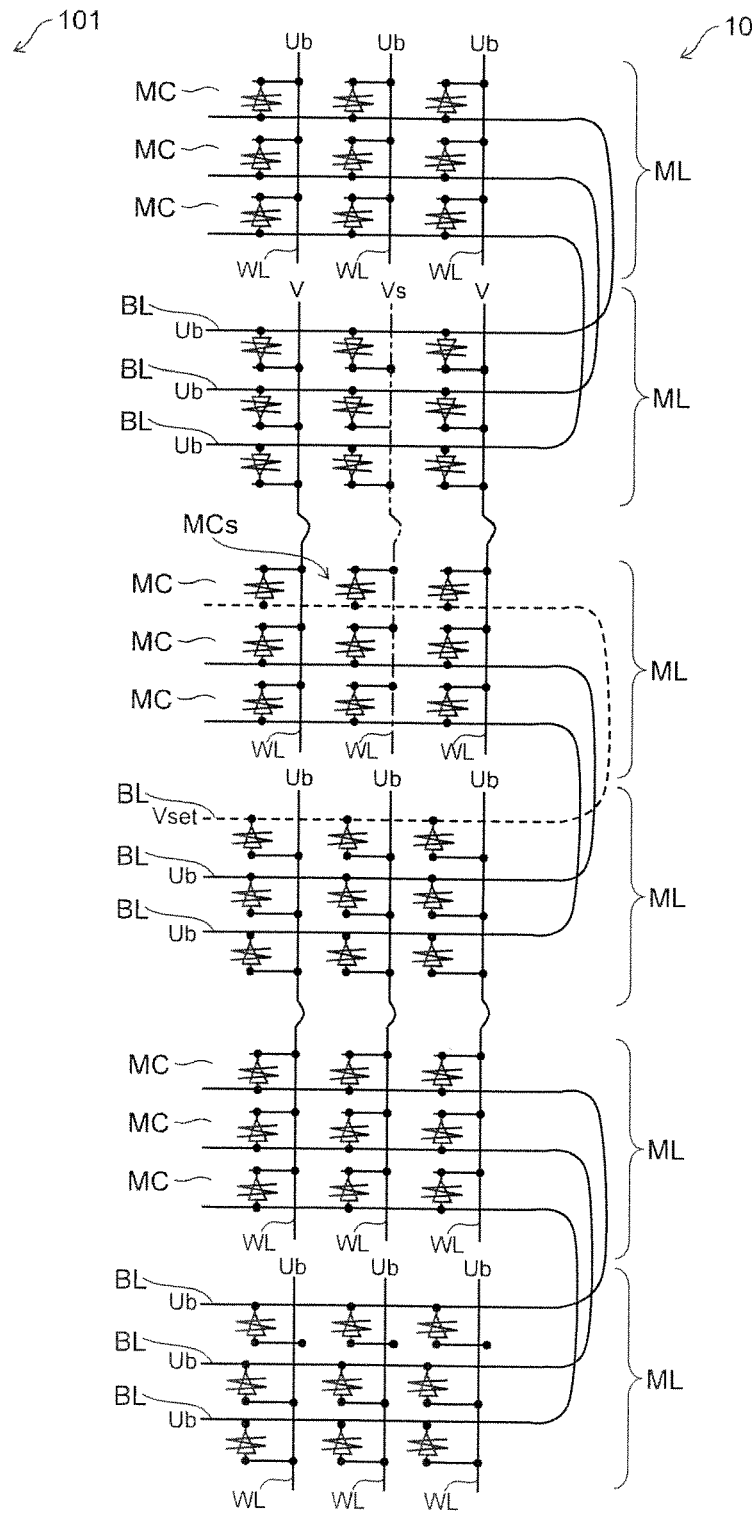
FIG. 2A
PRIOR ART
FIG. 2B
PRIOR ART

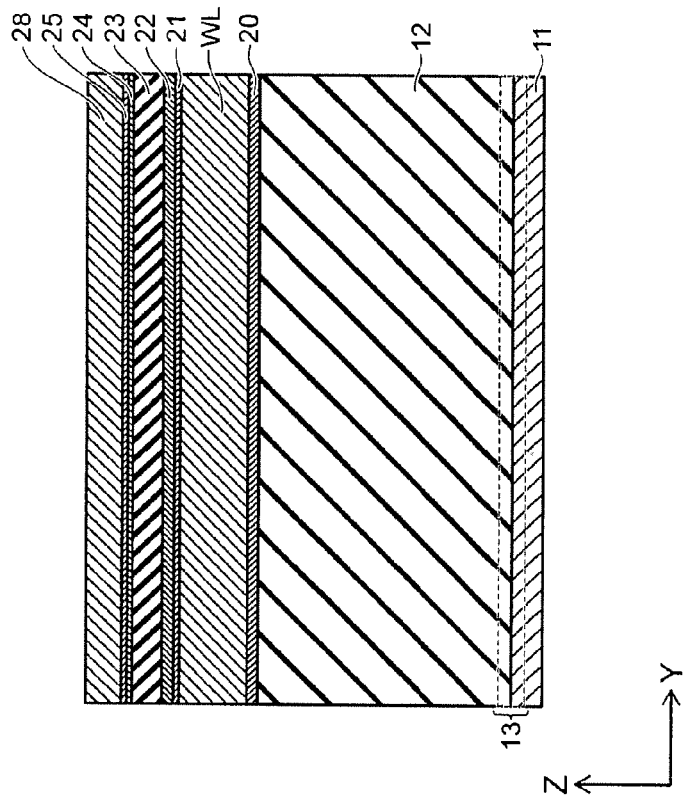
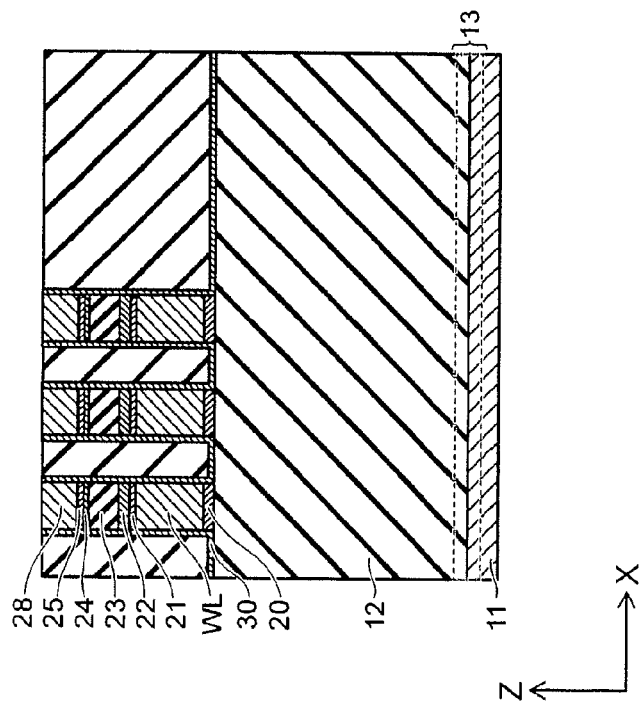
FIG. 13B
FIG. 13A

US 10,410,717 B2

RESISTIVE RANDOM ACCESS MEMORY DEVICE WITH THREE-DIMENSIONAL CROSS-POINT STRUCTURE AND METHOD OF OPERATING THE SAME

CROSS-REFERENCE TO RELATED APPLICATIONS

This application is based upon and claims the benefit of priority from U.S. Provisional Patent Application 62/304,601, filed on Mar. 7, 2016; the entire contents of which are incorporated herein by reference.

FIELD

Embodiments relate to a memory device.

BACKGROUND

In recent years, a memory device has been proposed in which a material having two resistance states is utilized. A three-dimensional cross-point structure has been proposed as a structure for integrating memory cells in such a memory device in which the memory cells are disposed at the crossing points between word lines and bit lines. The memory device having the three-dimensional cross-point structure is advantageous for higher integration; but the stability of the operations is a problem.

FIG. 1 is a perspective view showing a memory device according to the comparative example.

FIG. 2A and FIG. 2B are circuit diagrams showing the memory device according to the comparative example.

As shown in FIG. 1, the configuration of the memory device 101 according to the comparative example is a so-called three-dimensional cross-point structure. In the memory device 101, the bit line interconnect layers BLL and the word line interconnect layers WLL are stacked alternately; and the variable resistance members RC are connected between the bit lines BL and the word lines WL.

In the memory device 101 according to the modification as shown in FIG. 2A and FIG. 2B, the bit line interconnect layer BLL or the word line interconnect layer WLL is shared between the mutually-adjacent memory cell layers ML. Therefore, when applying the set potential Vset to the selected bit line connected to the selected cell MCs, the set potential Vset is applied also to one of the memory cell layers ML positioned adjacently on two sides of the memory cell layer ML to which the selected cell MCs belongs. Also, when applying the reference potential Vs to the selected word line WLs connected to the selected cell MCs, the reference potential Vs is applied also to the other of the memory cell layers ML positioned adjacently on the two sides. At this time, the interaction with the selected cell MCs is large because the memory cell layer ML to which the set potential Vset is applied and the memory cell layer ML to which the reference potential Vs is applied are disposed adjacent to the memory cell layer ML to which the selected cell MCs belongs. Therefore, the likelihood that misoperations may occur is high.

To relax the voltage between the interconnects in the adjacent memory cell layers ML to which the set potential Vset or the reference potential Vs is applied, it also may be considered to apply an appropriate potential to the other interconnects. However, in the memory device 101, because the memory cell layers ML are arranged to be continuous while sharing the bit line interconnect layer BLL or the word line interconnect layer WLL, when applying a potential to one memory cell layer ML, it is necessary to apply potentials also to the memory cell layers ML adjacent to the one memory cell layer ML to reduce the effects; and the driving is exceedingly complex.

BRIEF DESCRIPTION OF THE DRAWINGS

FIG. 2A and FIG. 2B are circuit diagrams showing the memory device according to the comparative example;

FIG. 13A to FIG. 17B are cross-sectional views showing a method for manufacturing a memory device according to a third embodiment.

DETAILED DESCRIPTION

A memory device according to an embodiment includes a first interconnect, a second interconnect, a first variable resistance member, a third interconnect, a second variable resistance member, a fourth interconnect, a fifth interconnect and a third variable resistance member. The first interconnect, the third interconnect and the fourth interconnect extend in a first direction. The second interconnect and the fifth interconnect extend in a second direction crossing the first direction. The first variable resistance member is connected between the first interconnect and the second interconnect. The second variable resistance member is connected between the second interconnect and the third interconnect. The third variable resistance member is connected between the fourth interconnect and the fifth interconnect. The fourth interconnect is insulated from the third interconnect. The first interconnect, the second interconnect, the third interconnect, the fourth interconnect and the fifth interconnect are arranged along a third-direction in this order. The third direction crosses the first direction and the second direction.

First, a first embodiment will be described.

Figure 1:
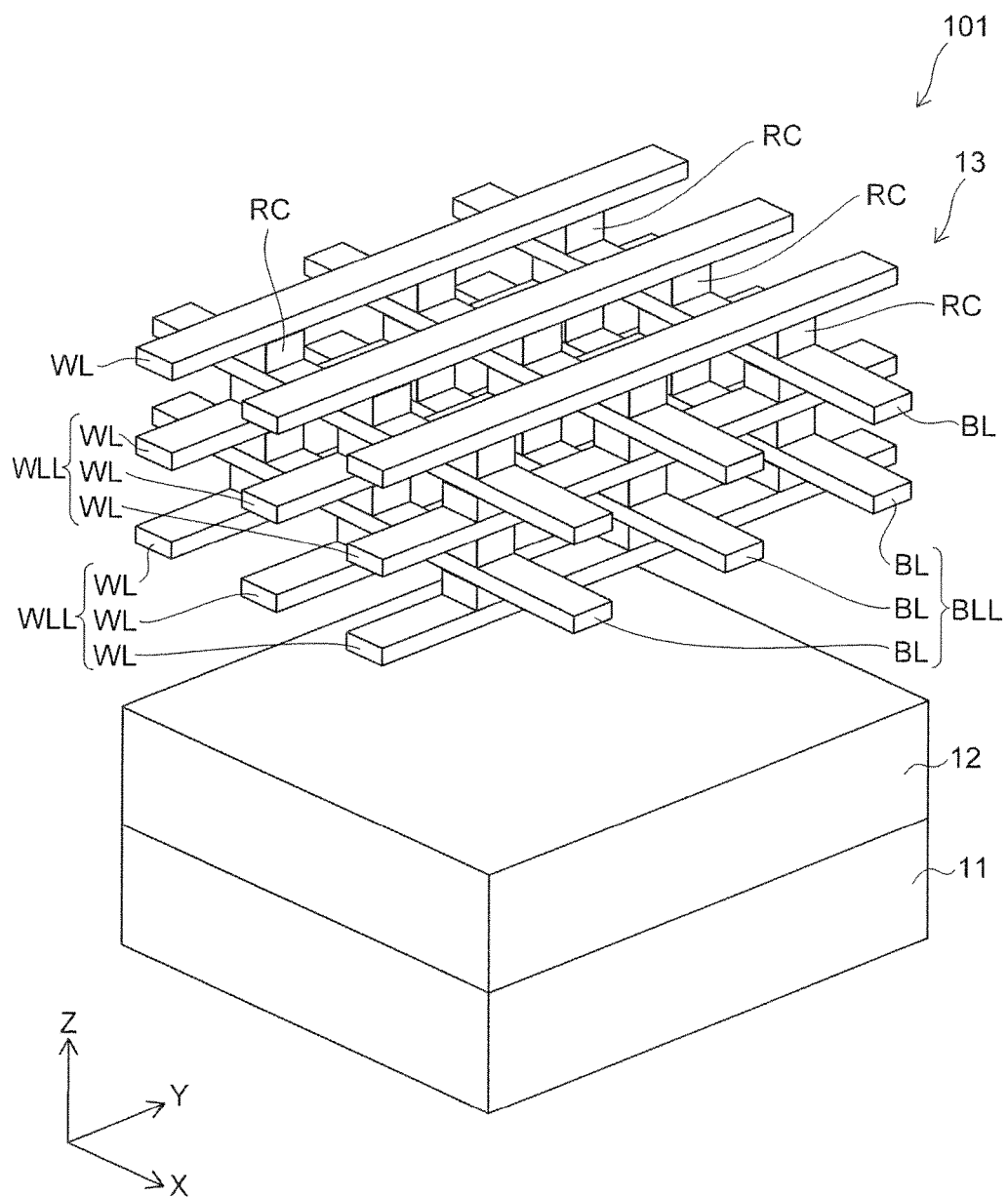
FIG. 1 is a perspective view showing a memory device according to a comparative example.
Figure 3:
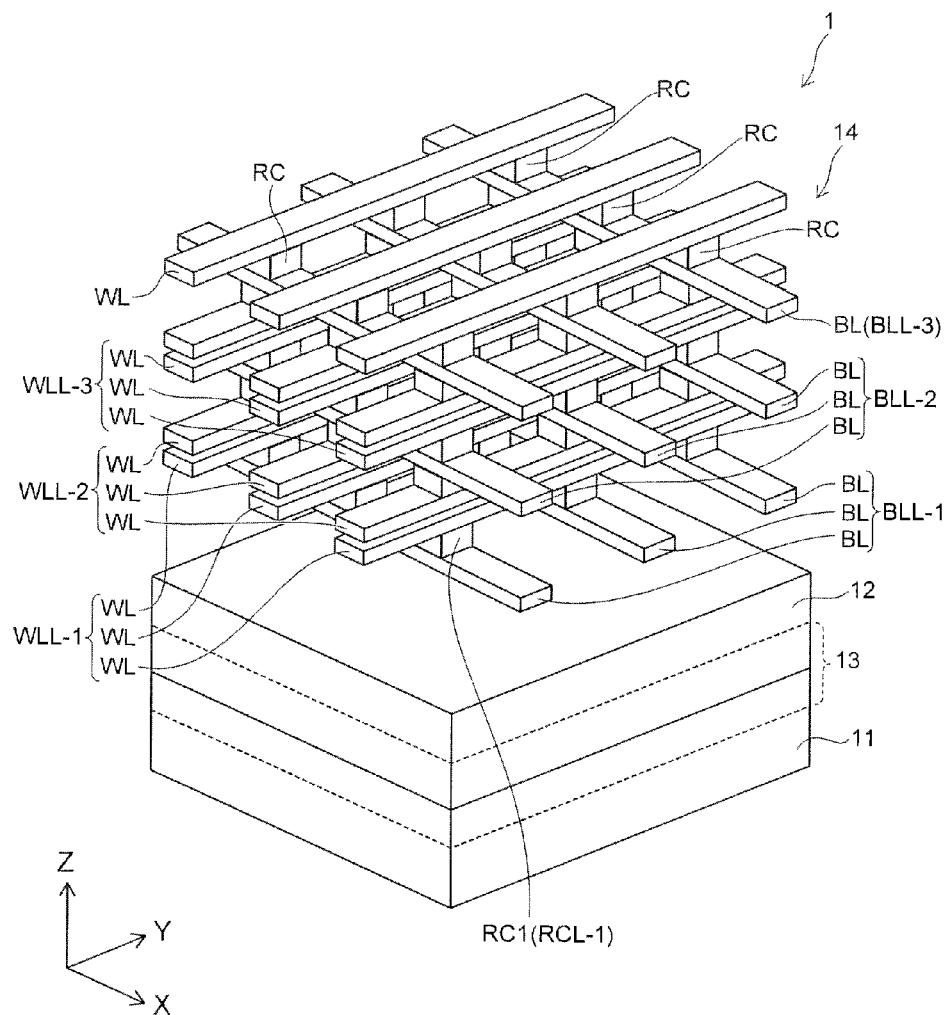
FIG. 3 is a perspective view showing a memory device according to a first embodiment.

FIG. 3 is a perspective view showing a memory device according to the embodiment.

Figure 4:
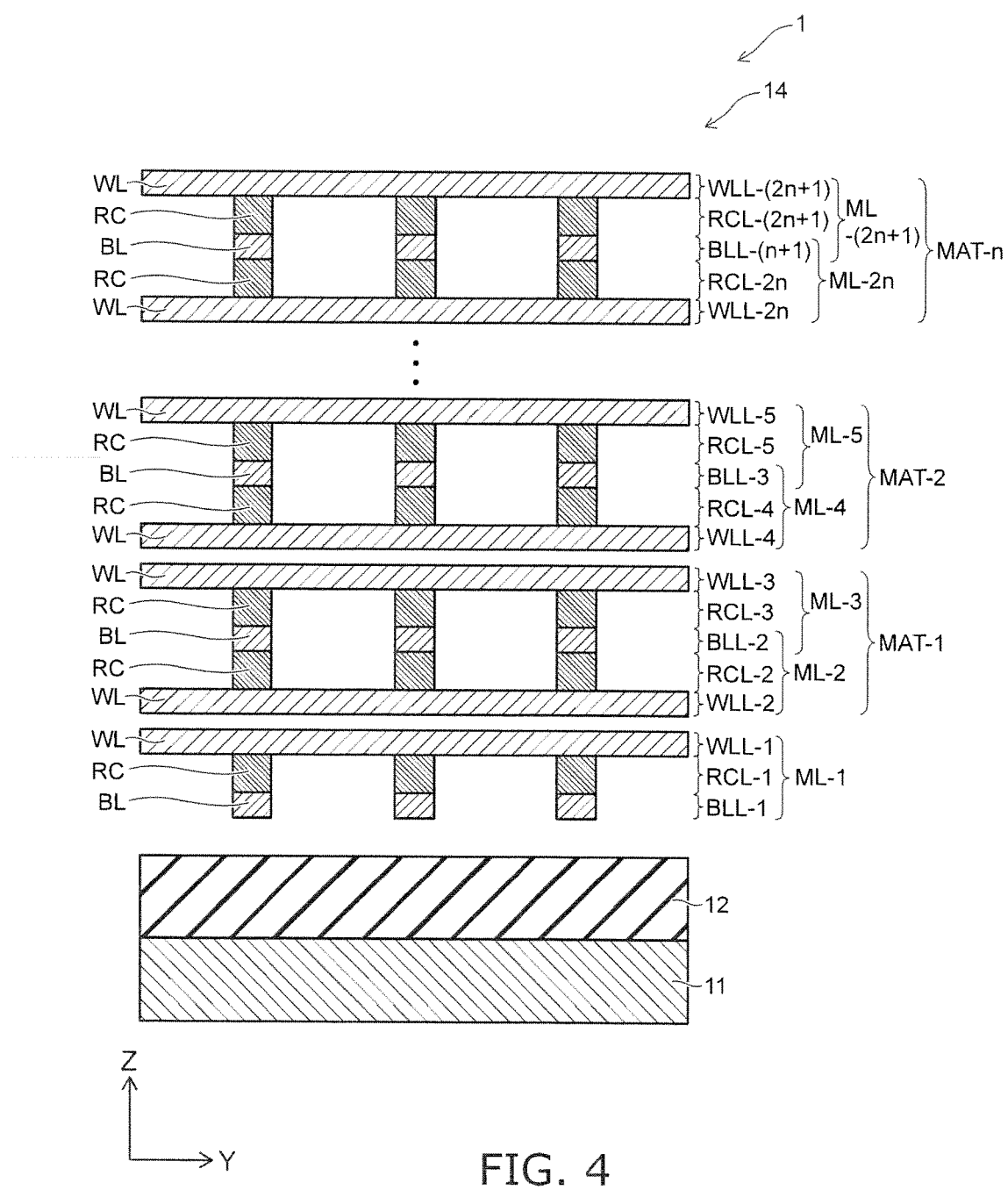
FIG. 4 is a schematic cross-sectional view showing the memory device according to the first embodiment.

FIG. 4 is a schematic cross-sectional view showing the memory device according to the embodiment.

The memory device according to the embodiment is a ReRAM (Resistance Random Access Memory), e.g., a CBRAM (Conductive Bridging Random Access Memory).

In the memory device 1 according to the embodiment as shown in FIG. 3 and FIG. 4, a silicon substrate 11 is provided; and a drive circuit 13 of the memory device 1 is formed in the upper layer portion of the silicon substrate 11 and on the upper surface of the silicon substrate 11. For example, an inter-layer insulating film 12 that is made of silicon oxide is provided on the silicon substrate 11 to bury the drive circuit 13; and a memory cell unit 14 is provided on the inter-layer insulating-film 12.

In the specification hereinbelow, an XYZ orthogonal coordinate system is employed for convenience of description. A direction connecting the silicon substrate 11 and the inter-layer insulating film 12 is taken as a "Z-direction;" and two mutually-orthogonal directions orthogonal to the Z-direction are taken as an "X-direction" and a "Y-direction." Also, in the specification, although a direction of the Z-direction from the silicon substrate 11 toward the inter-layer insulating film 12 also is called "up" and the reverse direction also is called "down," the differentiation is for convenience and is independent of the direction of gravity.

The memory cell unit 14 is a stacked body in which multiple bit lines BL and multiple word lines WL are stacked inside an inter-layer insulating film. The configuration of the memory cell unit 14 will now be described in detail.

In the memory cell unit 14, multiple levels of memory cell structure bodies MAT are stacked along the Z-direction. An inter-layer insulating film is interposed between the memory cell structure bodies MAT. For convenience of description in the specification, branch numbers may be attached to the reference numerals of multiple components according to the arrangement order counting from the lower side, i.e., the silicon substrate 11 side. For example, the multiple memory cell structure bodies MAT also are notated as the memory cell structure bodies MAT-1, MAT-2, . . . , MAT-n from the bottom toward the top.

In each memory cell structure body MAT, one bit line interconnect layer and two word line interconnect layers provided on two sides of the one bit line interconnect layer in the Z-direction are provided. The structure between the inter-layer insulating film 12 and the memory cell structure body MAT-1 of the lowermost level is an exception; and one layer of the bit line interconnect layer BLL-1 and one layer of the word line interconnect layer WLL-1 are provided. Accordingly, in the memory cell unit 14, from the bottom toward the top, the bit line interconnect layer BLL-1, the word line interconnect layer WLL-1, the word line interconnect layer WLL-2, the bit line interconnect layer BLL-2, the word line interconnect layer WLL-3, the word line interconnect layer WLL-4, the bit line interconnect layer BLL-3, the word line interconnect layer WLL-5, the word line interconnect layer WLL-6, the bit line interconnect layer BLL-4, the word line interconnect layer WLL-7, . . . , the word line interconnect layer WLL-2$n$, the bit line interconnect layer BLL-(n+1), the word line interconnect layer WLL-(2$n$+1), . . . , are provided in this order. n is an integer not less than 1.

The memory cell structure body MAT-1 is formed of the word line interconnect layer WLL-2, the bit line interconnect layer BLL-2, and the word line interconnect layer WLL-3; and the memory cell structure body MAT-2 is formed of the word line interconnect layer WLL-4, the bit line interconnect layer BLL-3, and the word line interconnect layer WLL-5. Generally expressed, one memory cell structure body MAT-n is formed of the word line interconnect layer WLL-2$n$, the bit line interconnect layer BLL-(n+1), and the word line interconnect layer WLL-(2$n$+1).

The multiple bit lines BL are provided in each bit line interconnect layer BLL. Each bit line BL extends in the X-direction. The multiple bit lines BL are arranged to be separated from each other along the Y-direction in each bit line interconnect layer BLL.

The multiple word lines WL are provided in each word line interconnect layer WLL. Each word line WL extends in the Y-direction. The multiple word lines WL are arranged to be separated from each other along the X-direction in each word line interconnect layer WLL.

The memory cell structure bodies MAT are disposed to be separated from each other spatially. The word line WL of the uppermost layer of one memory cell structure body MAT-k and the word line WL of the lowermost layer of the memory cell structure body MAT-(k+1) of one level above the memory cell structure body MAT-k are insulated from each other. However, as described below, the word lines WL are bundled according to a prescribed rule at the end portion of the memory cell unit 14.

Variable resistance members RC are connected between the bit lines BL and the word lines WL inside each memory cell structure body MAT. For example, in the memory cell structure body MAT-1, a variable resistance member layer RCL-2 that includes the multiple variable resistance members RC arranged in a matrix configuration along the X-direction and the Y-direction is disposed between the word line interconnect layer WLL-2 and the bit line interconnect layer BLL-2. A variable resistance member layer RCL-3 that includes the multiple variable resistance members RC is disposed between the bit line interconnect layer BLL-2 and the word line interconnect layer WLL-3.

Generally, when n is 1 or more, the variable resistance member layer RCL-2$n$ is disposed between the word line interconnect layer WLL-2$n$ and the bit line interconnect layer BLL-(n+1) in the memory cell structure body MAT-n. The variable resistance member layer RCL-(2$n$+1) is disposed between the bit line interconnect layer BLL-(n+1) and the word line interconnect layer WLL-(2$n$+1). The variable resistance member layer RCL-1 is disposed between the bit line interconnect layer BLL-1 and the word line interconnect layer WLL-1.

The configuration of each of the variable resistance members RC substantially is a quadrilateral prism extending in the vertical direction. One memory cell includes one variable resistance member RC connected between one bit line BL and one word line WL. Therefore, a memory cell layer ML-1 in which the memory cells are arranged in a planar matrix configuration includes the bit line interconnect layer BLL-1, the variable resistance member layer RCL-1, and the word line interconnect layer WLL-1. Generally, in the memory cell structure body MAT-n, the memory cell layer ML-2$n$ includes the word line interconnect layer WLL-2$n$, the variable resistance member layer RCL-2$n$, and the bit line interconnect layer BLL-(n+1); and the memory cell layer ML-(2$n$+1) includes the bit line interconnect layer BLL-(n+1), the variable resistance member layer RCL-(2$n$+1), and the word line interconnect layer WLL-(2$n$+1). The memory cell layer ML-2$n$ and the memory cell layer ML-(2$n$+1) share the bit line interconnect layer BLL-(n+1).

The configuration of the variable resistance member RC will now be described.

Figure 5:
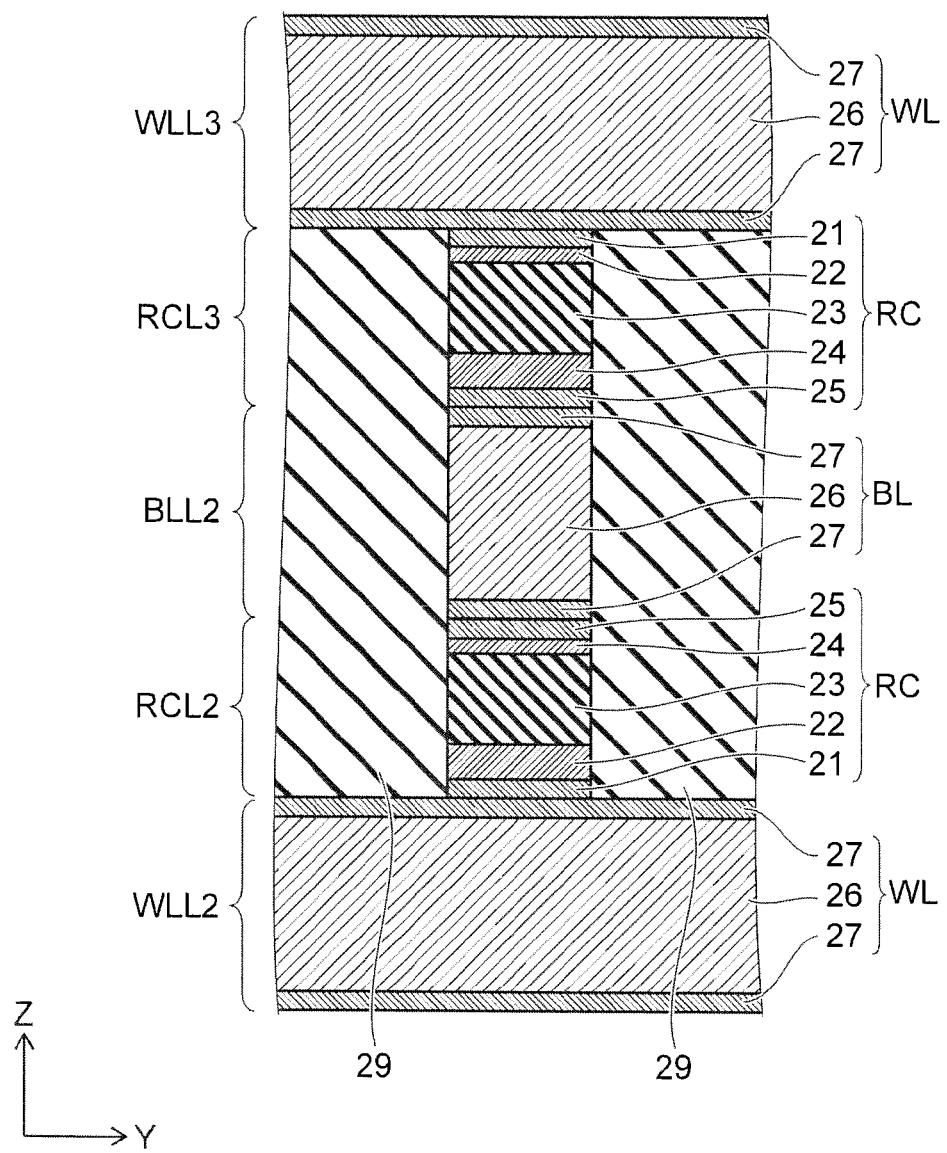
FIG. 5 is a partially enlarged cross-sectional view showing a memory cell unit of the memory device according to the first embodiment.

FIG. 5 is a partially enlarged cross-sectional view showing the memory cell unit of the memory device according to the embodiment.

As shown in FIG. 5, a barrier metal layer 21, a high resistance layer 22, an ion-movement layer 23, a metal layer 24, and a barrier metal layer 25 are stacked in this order from the word line WL side toward the bit line BL side in the variable resistance member RC. Accordingly, the arrangement order in the Z-direction is reversed between the variable resistance 7 member RC having the lower end connected to the word line WL and the upper end connected to the bit line BL and the variable resistance member RC having the lower end connected to the bit line BL and the upper end connected to the word line WL.

The metal layer 24 is a layer including a metal that can move through the ion-movement layer 23 by ionizing and includes, for example, at least one type of metal selected from the group consisting of gold (Au), silver (Ag), copper (Cu), platinum (Pt), palladium (Pd), titanium (Ti), iron (Fe), chrome (Cr), cobalt (Co), nickel (Ni), aluminum (Al), indium (In), tellurium (Te), sodium (Na), and calcium (Ca).

The ion-movement layer 23 is a layer through which the ions of the metal included in the metal layer 24 can move and includes, for example, at least one type of material selected from the group consisting of silicon (Si), silicon oxide (SiO), silicon nitride (SiN), silicon oxynitride (SiON), silicon sulfide (SiS), silicon chloride (SiCl), hafnium oxide (HfO), hafnium nitride (HfN), a hafnium silicate compound (HfSi), zirconium oxide (ZrO), zirconium nitride (ZrN), a zirconium silicate compound (ZrSi), aluminum oxide (AlO), aluminum nitride (AlN), an aluminum silicate compound (AlSi), titanium oxide (TiO), titanium nitride (TiN), and a titanium silicate compound (TiSi). The resistivity of the ion-movement layer 23 in the state in which a filament is not formed is higher than the resistivity of the metal layer 24.

The high resistance layer 22 is a layer for limiting the current flowing in the variable resistance member RC and is connected in series with the ion-movement layer 23 and the metal layer 24. The resistivity of the high resistance layer 22 is higher than the resistivity of the word line WL and the resistivity of the bit line BL. The high resistance layer 22 is formed of titanium silicate nitride (TiSiN) or tantalum silicate nitride (TaSiN).

The barrier metal layer 21 suppresses the diffusion of the material of the word line WL inside the variable resistance member RC. The barrier metal layer 25 suppresses the diffusion of the material of the bit line BL inside the variable resistance member RC. For example, the barrier metal layers 21 and 25 are formed of titanium or titanium nitride.

The word line WL and the bit line BL each are formed of a main body unit 26 made of, for example, tungsten (W) and a barrier metal layer 27 made of, for example, tungsten nitride (WN), titanium nitride, or titanium formed on the upper surface and the lower surface of the main body unit 26.

In the memory cell unit 14, an inter-layer insulating film 29 that is made of, for example, silicon oxide is provided between the word lines WL, between the bit lines BL, and between the variable resistance members.

Interconnect draw-out portions will now be described.

The interconnect draw-out portions are disposed on the two X-direction sides and the two Y-direction sides of the memory cell unit 14. The draw-out portions of the word lines WL disposed on the two Y-direction sides of the memory cell unit 14 will now be described.

Figure 6:
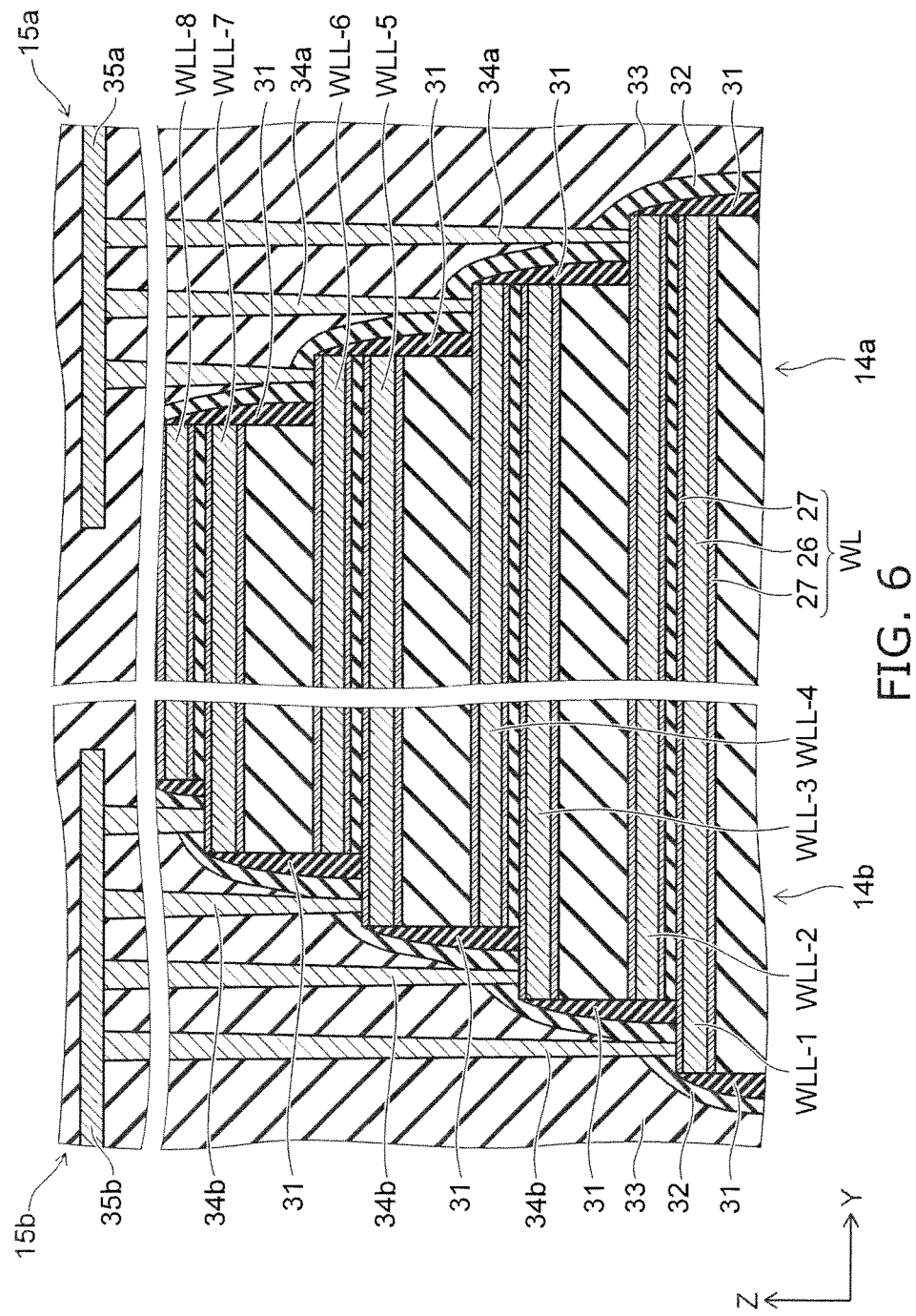
FIG. 6 is a cross-sectional view showing an interconnect draw-out portion of the memory device according to the first embodiment.

FIG. 6 is a cross-sectional view showing the interconnect draw-out portion of the memory device according to the embodiment.

As shown in FIG. 6, word line draw-out portions 15a and 15b are portions that draw out the word lines WL from end portions 14a and 14b on the two Y-direction sides of the memory cell unit 14. The configurations of the end portions 14a and 14b are stairstep configurations. In the end portions 14a and 14b, one level of steps is formed every two layers of the word line interconnect layers WLL. However, the positions of the steps in the vertical direction are shifted one layer of the word line interconnect layers WLL between the end portion 14a and the end portion 14b.

In other words, in the end portion 14a, one step is formed of the word line interconnect layers WLL-1 and WLL-2; and one step is formed of the word line interconnect layers WLL-3 and WLL-4. On the other hand, in the end portion 14b, one step is formed of the word line interconnect layers WLL-2 and WLL-3; and one step is formed of the word line interconnect layers WLL-4 and WLL-5.

Expressed more generally, in the end portion 14a, one step is formed of the word line interconnect layers WLL-n and WLL-(n+1); and in the end portion 14b, one step is formed of the word line interconnect layers WLL-(n+1) and WLL-(n+2).

The end surface of the word line WL at each step is covered with a sidewall 31 that is insulative. For example, the sidewall 31 is formed of silicon oxide. Also, a liner film 32 that is made of, for example, silicon nitride is provided to cover the end portion 14a and the sidewall 31 and to cover the end portion 14b and the sidewall 31. An inter-layer insulating film 33 is provided on the liner film 32 to cover the end portions 14a and 14b. For example, the inter-layer insulating film 33 is formed of silicon oxide.

Contacts 34a and an upper layer interconnect 35a are provided in regions directly above the end portion 14a inside the inter-layer insulating film 33. The lower end portions of the contacts 34a pierce the liner film 32 and are connected to the word lines WL included in each step of the end portion 14a. In other words, the contacts 34a are connected to the word lines WL belonging to the even-numbered word line interconnect layers counting from the silicon substrate 11 side. Also, the upper ends of the contacts 34a are connected to the common upper layer interconnect 35a. As a result, the even-numbered word lines WL arranged in one column along the Z-direction have a common connection with one upper layer interconnect 35a.

Contacts 34b and an upper layer interconnect 35b are provided in regions directly above the end portion 14b inside the inter-layer insulating film 33. The lower end portions of the contacts 34b pierce the liner film 32 and are connected to the word lines WL included in each step of the end portion 14b. In other words, the contacts 34b are connected to the word lines WL belonging to the odd-numbered word line interconnect layers counting from the silicon substrate 11 side. Also, the upper ends of the contacts 34b are connected to the common upper layer interconnect 35b. As a result, the odd-numbered word lines WL arranged in one column along the Z-direction have a common connection with one upper layer interconnect 35b.

Figures 7A, 7B:
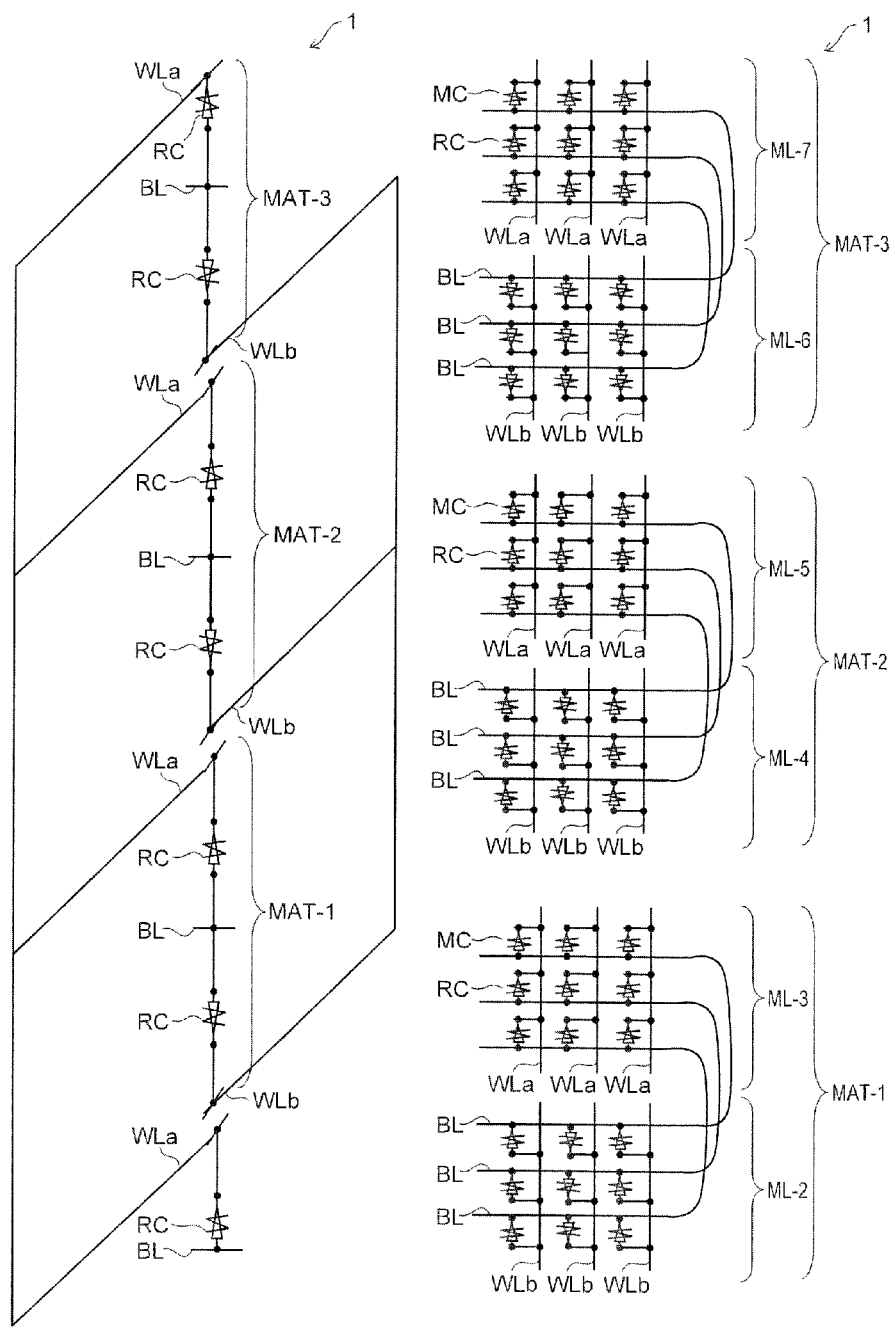
FIG. 7A and FIG. 7B are circuit diagrams showing the memory device according to the first embodiment.

FIG. 7A and FIG. 7B are circuit diagrams showing the memory device according to the embodiment.

In the memory cell unit 14 as shown in FIG. 7A, the variable resistance members RC are connected between one bit line BL and two word lines WL disposed above and below the one bit line BL; and each of the variable resistance members RC has a rectifying property that allows a current to flow in the direction from the bit line BL toward the word line WL but does not allow a current to flow in the reverse direction. Also, the word lines WL belonging to the odd-numbered word line interconnect layers from the bottom (hereinbelow, also called the "word lines WLa") are connected to each other; and the word lines WL belonging to the even-numbered word line interconnect layers (hereinbelow, also called the "word lines WLb") also are connected to each other.

Also, as shown in FIG. 7B, each of the memory cell structure bodies MAT includes two layers of the word line interconnect layers WLL adjacent to each other in the Z-direction and one layer of the bit line interconnect layers BLL disposed between the two layers of the word line interconnect layers WLL. Each of the memory cell structure bodies MAT includes two layers of the memory cell layers ML; and each of the memory cell layers ML includes one layer of the word line interconnect layers WLL, a variable resistance member layer RCL, and the bit line interconnect layer BLL. Accordingly, the two layers of the memory cell layers ML share the one layer of the bit line interconnect layers BLL.

Operations of each of the variable resistance members RC will now be described.

In the memory device 1 as shown in FIG. 3, the drive circuit 13 selects the resistance state of the variable resistance member RC and identifies the resistance state of the variable resistance member RC by applying voltages to the variable resistance member RC via the word line WL and the bit line BL.

First, a program operation will be described.

A set operation in which the variable resistance member RC is caused to transition from a high resistance state to a low resistance state will be described. When the drive circuit 13 applies, to the variable resistance member RC in the high resistance state, a set voltage such that the bit line BL becomes positive and the word line WL becomes negative, the metal atoms that are included in the metal layer 24 become positive ions and move toward the word line WL which is negative as shown in FIG. 5. Then, the metal atoms precipitate inside the ion-movement layer 23 by combining with electrons supplied from the word line WL; and a filament is formed inside the ion-movement layer 23. The filament is used as a current path; and the variable resistance member RC is switched to the low resistance state.

A reset operation of causing the variable resistance member RC to transition from the low resistance state to the high resistance state will be described. When the drive circuit 13 (referring to FIG. 3) applies, to the variable resistance member RC in the low resistance state, a reset voltage such that the bit line BL becomes negative and the word line WL becomes positive, the metal atoms that form the filament become positive ions and move toward the bit line BL which is negative. Then, the metal atoms precipitate inside the metal layer 24 by combining with electrons supplied from the bit line BL. Thereby, at least a portion of the filament formed inside the ion-movement layer 23 disappears; and the variable resistance member RC is switched to the high resistance state by the current path being broken. A value can be programmed to the memory cell by setting the variable resistance member RC to the low resistance state or the high resistance state.

A read operation will now be described.

The drive circuit 13 (referring to FIG. 3) senses the resistance state of the variable resistance member RC by sensing the current flowing in the variable resistance member RC by applying, to the variable resistance member RC, a read voltage that is lower than the set voltage and is positive such that the bit line BL becomes positive and the word line WL becomes negative. Thereby, the value that is programmed to the memory cell can be read. If the drive circuit 13 (referring to FIG. 3) applies the read voltage having the reverse polarity to the variable resistance member RC in the low resistance state, the tip of the filament is broken; and the current does not flow easily. If a read voltage that is positive is applied to the variable resistance member RC in this state, the tip of the filament is restored; and a current flows. Therefore, the variable resistance member RC functions also as a rectifying element that allows the current to flow from the bit line BL toward the word line WL but does not allow a current to flow in the reverse direction.

A driving method of the memory device according to the embodiment will now be described.

First, the set operation will be described.

Figure 8:
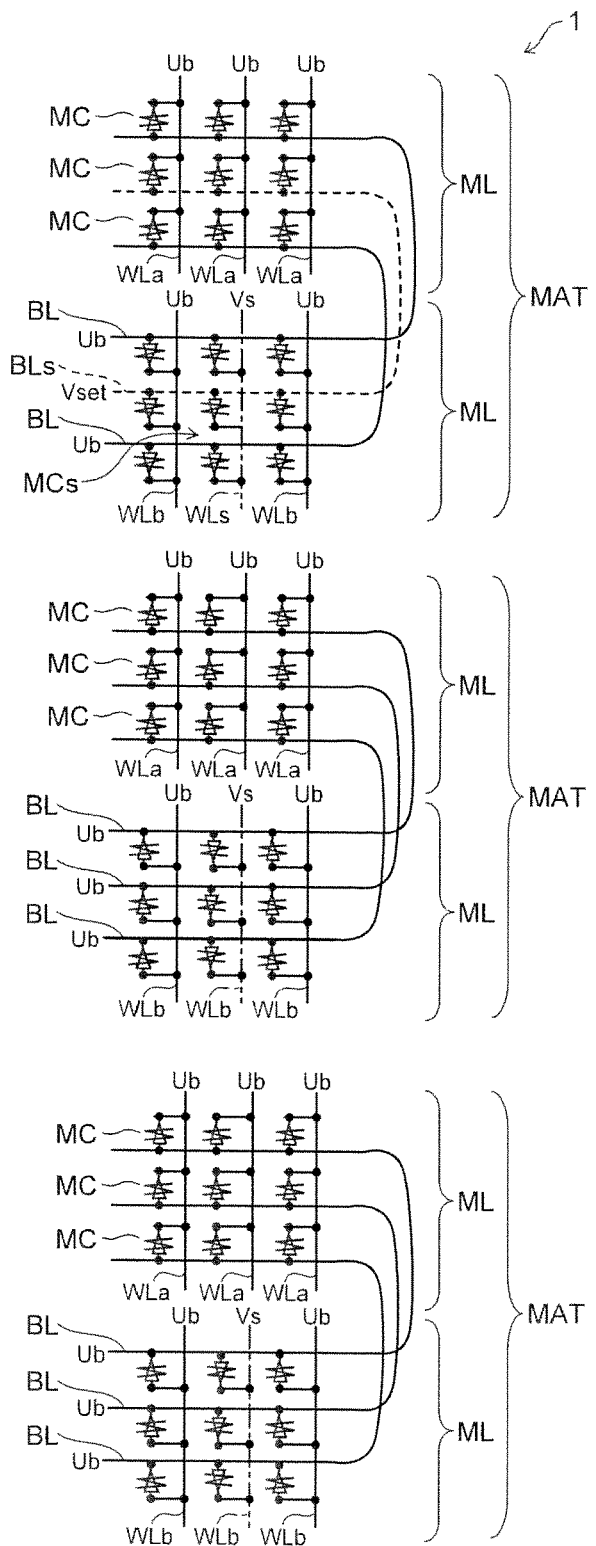
FIG. 8 is a circuit diagram showing a set operation of the memory device according to the first embodiment.

FIG. 8 is a circuit diagram showing the set operation of the memory device according to the embodiment.

As shown in FIG. 8, one memory cell MC is selected and set. At this time, a set potential Vset is applied to the bit line BL (hereinbelow, called the "selected bit line BLs") connected to the selected memory cell MC (hereinbelow, called the "selected cell MCs"); and a reference potential Vs is applied to the word line WL (hereinbelow, called the "selected word line WLs") connected to the selected cell MCs. The reference potential Vs may be the ground potential. In the memory cell structure bodies MAT other than the memory cell structure body MAT to which the selected cell MCs belongs, the reference potential Vs is applied to the word lines WL corresponding to the selected word line WLs via the contacts 34a or 34b and the upper layer interconnects 35a and 35b.

An intermediate potential Ub is applied to the bit lines BL and the word lines WL other than those recited above. The intermediate potential Ub is a potential between the reference potential Vs and the set potential Vset, e.g., ((Vset−Vs)/2+Vs).

In FIG. 8, the interconnects to which the set potential Vset is applied are drawn with a broken line; the interconnects to which the reference potential Vs is applied are drawn with single dot-dash lines; and the interconnects to which the intermediate potential Ub is applied are drawn with solid lines.

Thereby, the set voltage (Vset−Vs) is applied to the selected cell MCs; and the selected cell MCs is set. Also, among the other memory cells MC belonging to the memory cell structure body MAT to which the selected cell MCs belongs, the voltage (Vset−Ub) is applied to the memory cells MC connected between the selected bit line BLs and the unselected word lines WL and the voltage (Ub−Vs) is applied to the memory cells MC connected between the selected word line WL and the unselected bit lines BL; but the memory cells MC are not set because these voltages are lower than the set voltage. The voltage (Ub−Ub) that is applied to the memory cells MC connected between the unselected bit lines BL and the unselected word lines WL is substantially zero.

In the memory cell structure bodies MAT other than the memory cell structure body MAT to which the selected cell MCs belongs, the voltage (Ub−Vs) is applied to the memory cells MC connected to the word lines WL corresponding to the selected word line WLs; and a voltage substantially is not applied to the memory cells MC other than the memory cells MC connected to the word lines WL corresponding to the selected word line WLs. Therefore, none of these memory cells MC are set.

Other memory cell layers ML are interposed between the memory cell layer ML to which the selected cell MCs belongs and the memory cell layers ML in the memory cell structure bodies MAT to which the voltage (Ub−Vs) is applied other than the memory cell structure body MAT to which the selected cell MCs belongs. Thus, misoperations do not occur easily because the memory cell layers ML to which the voltage (Ub−Vs) is applied are separated from the selected cell MCs periphery where stress is applied.

The reset operation will now be described.

Figure 9:
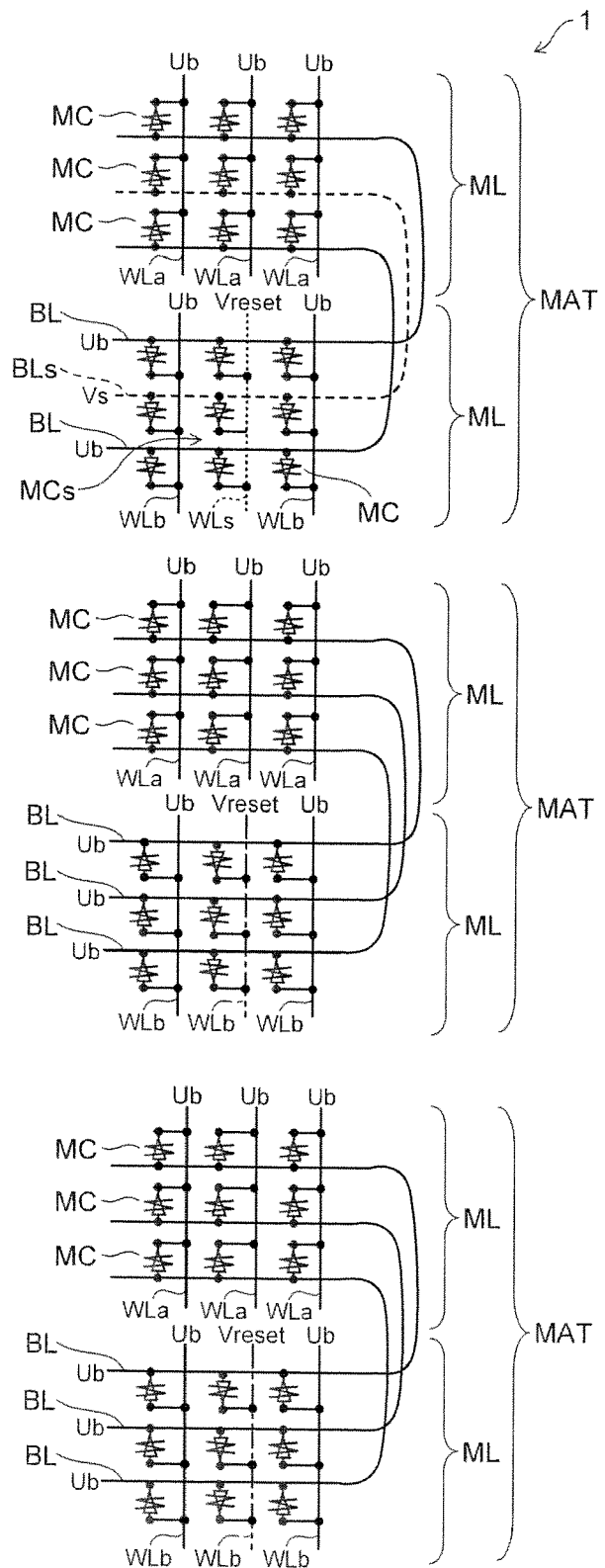
FIG. 9 is a circuit diagram showing a reset operation of the memory device according to the first embodiment.

FIG. 9 is a circuit diagram showing the reset operation of the memory device according to the embodiment.

As shown in FIG. 9, the reference potential Vs is applied to the selected bit line BLs; and a reset potential Vreset is applied to the selected word line WLs. In the memory cell structure bodies MAT other than the memory cell structure body MAT to which the selected cell MCs belongs, the reset potential Vreset is applied to the word lines WL corresponding to the selected word line WLs via the contacts 34a or 34b and the upper layer interconnects 35a and 35b.

The intermediate potential Ub is applied to the bit lines BL and the word lines WL other than those recited above. The intermediate potential Ub is a potential between the reference potential Vs and the reset potential Vreset, e.g., ((Vreset−Vs)/2+Vs). In FIG. 9, the interconnects to which the reset potential Vreset is applied are drawn with broken lines; the interconnects to which the reference potential Vs is applied are drawn with a single dot-dash line; and the interconnects to which the intermediate potential Ub is applied are drawn with solid lines.

Thereby, the reset voltage (Vreset−Vs) is applied to the selected cell MCs; and the selected cell MCs is reset. Also, among the other memory cells MC belonging to the memory cell structure body MAT to which the selected cell MCs belongs, the voltage (Ub−Vs) is applied to the memory cells MC connected between the selected bit line BLs and the unselected word lines WL and the voltage (Vreset−Ub) is applied to the memory cells MC connected between the selected word line WLs and the unselected bit lines BL; but these memory cells MC are not reset because these voltages are lower than the reset voltage. The voltage that is applied to the memory cells MC connected between the unselected bit lines BL and the unselected word lines WL is substantially zero.

In the memory cell structure bodies MAT other than the memory cell structure body MAT to which the selected cell MCs belongs, the voltage (Vreset−Ub) is applied to the memory cells MC connected to the word lines WL corresponding to the selected word line WLs; and a voltage substantially is not applied to the memory cells MC other than the memory cells MC connected to the word lines WL corresponding to the selected word line WLs. Therefore, none of these memory cells MC are reset.

Other memory cell layers ML are interposed between the memory cell layer ML to which the selected cell MCs belongs and the memory cell layers ML to which the voltage (Vreset−Ub) is applied. Thus, misoperations do not occur easily because the memory cell layers ML to which the voltage (Vreset−Ub) is applied are separated from the selected cell MCs periphery where stress is applied.

Effects of the embodiment will now be described.

In the memory device 1 according to the embodiment as described above, because the bit lines BL and the word lines WL are partitioned between the memory cell structure bodies MAT, there is little effect on the other memory cell structure bodies MAT when applying the set voltage or the reset voltage to the selected cell MCs. Also, in the memory cell structure bodies MAT other than the memory cell structure body MAT to which the selected cell MCs belongs, the memory cell layers ML to which the voltage is unavoidably applied accompanying the set operation or the reset operation of the selected cell MCs are separated from the memory cell layer ML to which the selected cell MCs belongs. Therefore, misoperations of the other memory cells accompanying the set operation and the reset operation of the selected cell MCs can be suppressed. As a result, the operations of the memory device 1 are stable.

Second Embodiment

A second embodiment will now be described.

Figure 10A:
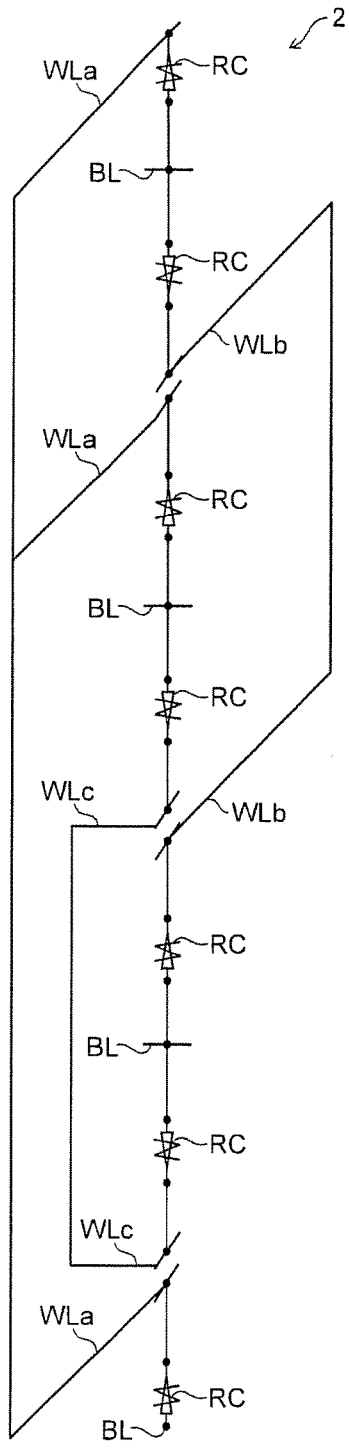
FIG. 10A and FIG. 10B are circuit diagrams showing a set operation of a memory device according to a second embodiment.
Figure 10B:
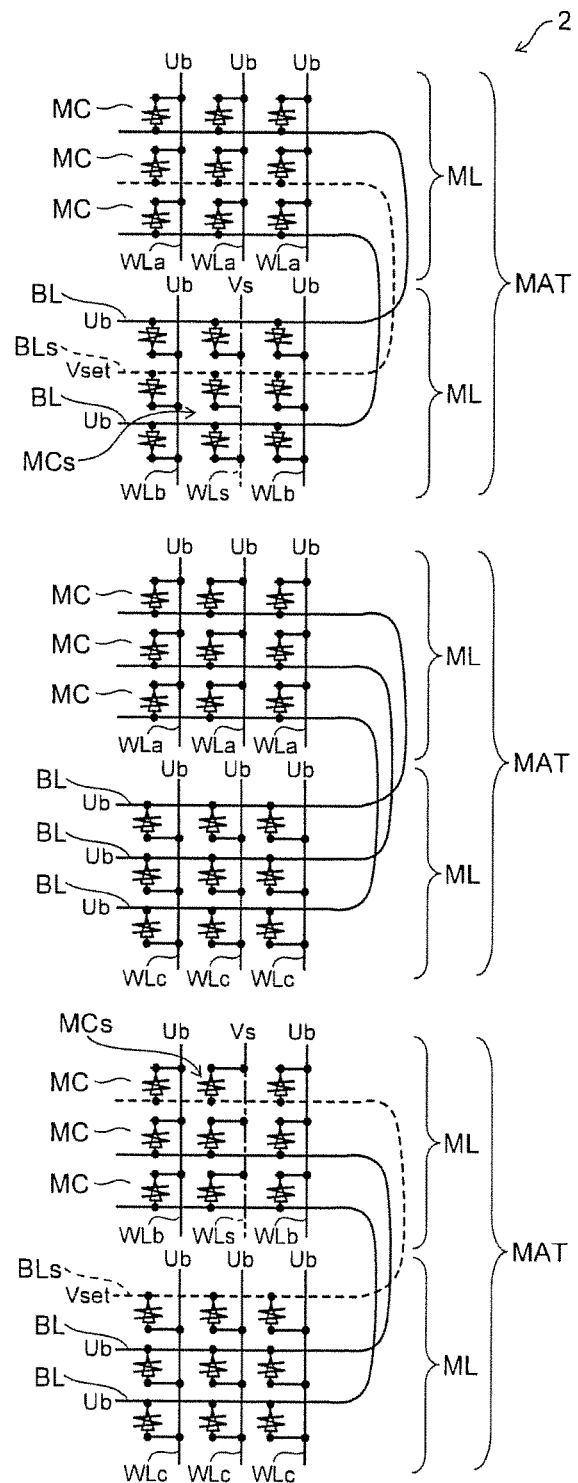

FIG. 10A and FIG. 10B are circuit diagrams showing the set operation of a memory device according to the embodiment.

Figure 11:
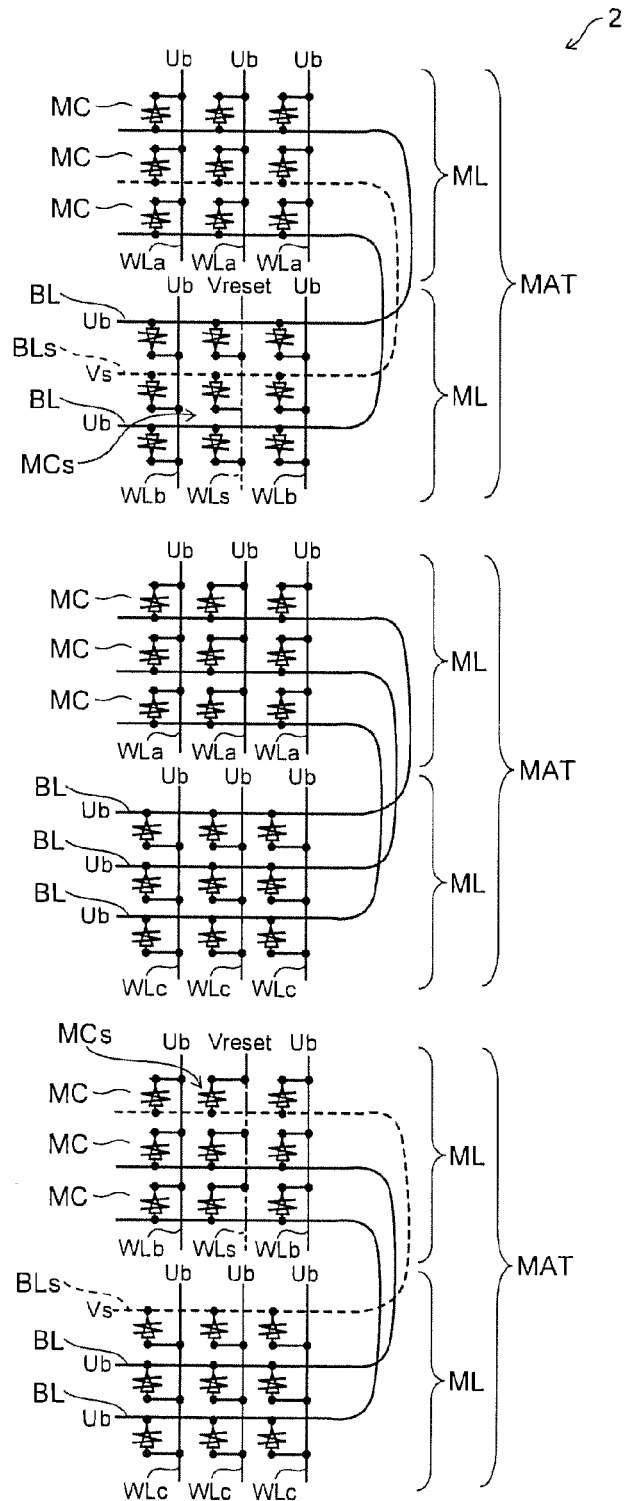
FIG. 11 is a circuit diagram showing a reset operation of the memory device according to the second embodiment.

FIG. 11 is a circuit diagram showing the reset operation of the memory device according to the embodiment.

Figure 12:
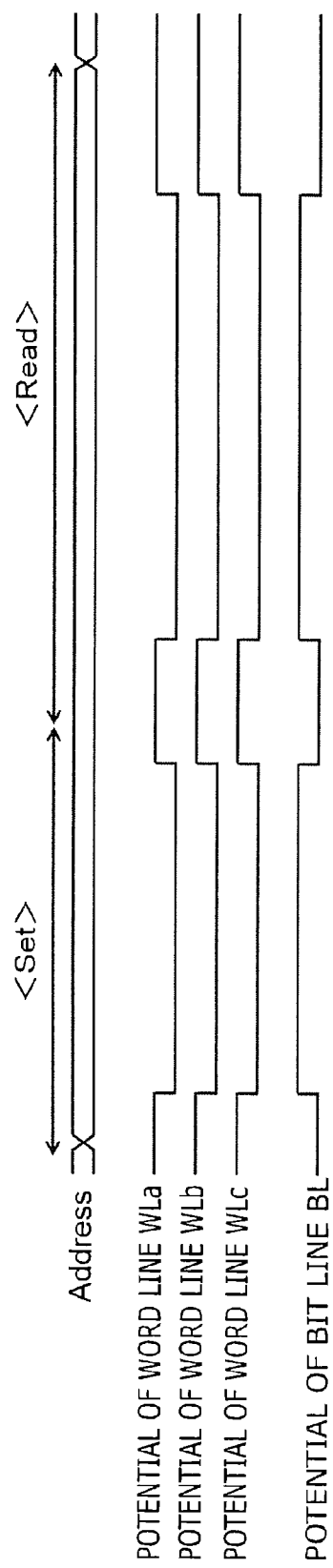
FIG. 12 is a timing chart showing the operations of the memory device according to the second embodiment.

FIG. 12 is a timing chart showing the operations of the memory device according to the embodiment.

In the memory device 2 according to the embodiment as shown in FIG. 10A and FIG. 10B, the word lines WL are bundled into three systems. In FIG. 10A, FIG. 10B, and FIG. 11, the word lines WL that are bundled into the three systems are notated as the word lines WLa, WLb, and WLc. The word lines WL that are included in one word line interconnect layer WLL are of one of these types.

In the memory device 2 as shown in FIG. 10A and FIG. 10B, one memory cell structure body MAT is configured by stacking the word line interconnect layer WLL including the word lines WLc, the bit line interconnect layer BLL, and the word line interconnect layer WLL including the word lines WLb in this order (hereinbelow, notated as "(WLc/BL/WLb)"). The memory cell structure body MAT having a (WLc/BL/WLa) configuration is provided on the one memory cell structure body MAT. The memory cell configuration having a (WLb/BLL/WLa) configuration is on the memory cell structure body MAT having the (WLc/BL/WLa) configuration.

Thus, in the memory device 2, the memory cell structure body MAT includes one layer of the bit line interconnect layers BLL and two types of word line interconnect layers WLL of the word line interconnect layers WLL classified into the three types. In such a case, the word line interconnect layers WLL that have the same type are not adjacent to each other. The word lines WLa that are at overlapping positions as viewed from the Z-direction are connected to each other. This is similar for the word lines WLb and WLc as well. The bit lines BL are independent from each other.

Then, in the set operation as shown in FIG. 10B, for example, one of the word lines WLb is selected; and the reference potential Vs is applied. At this time, the reference potential Vs is applied also to the corresponding word line WLb in the other memory cell structure body MAT. Also, any bit line BL is selected; and the set potential Vset is applied. Thereby, the selected cells MCs that are connected between the selected word lines WLs and the selected bit lines BLs are set. Two or more selected bit lines BLs can be set simultaneously inside the memory device 2. Thereby, at least two selected cells MCs can be set simultaneously.

At this time, in the example shown in FIG. 10B, the memory cell structure body MAT in which the intermediate potential Ub is applied to all of the word lines WL and all of the bit lines BL is disposed between the multiple memory cell structure bodies MAT to which the selected cells MCs belong. Thereby, the memory cell structure body MAT having the intermediate potential Ub functions as a shield; and interference between the memory cells above and below can be suppressed.

As shown in FIG. 11, this is similar also in the reset operation. For example, one of the word lines WLb is selected; and the reset potential Vreset is applied. The reset potential Vreset is applied also to the corresponding word line WLb of the other memory cell structure body MAT. Also, any bit line BL is selected; and the reference potential Vs is applied. Thereby, the selected cells MCs connected between the selected word lines WLs and the selected bit lines BLs are reset. Similarly to the set operation described above, the multiple selected cells MCs can be reset simultaneously by selecting the multiple bit lines BL. At this time, because the memory cell structure body MAT in which only the intermediate potential Ub is applied is interposed between the memory cell structure bodies MAT to which the selected cells belong, the memory cell structure body MAT of the intermediate potential Ub is used as a shield; and the interference between the memory cells can be suppressed. As a result, misoperations of memory cells are suppressed; and the operations are stable.

In the embodiment as shown in FIG. 12, in the set operation and the read operation, the timing of applying prescribed potentials to the word line WLa, the word line WLb, the word line WLc, and the bit line BL is substantially simultaneous. This is similar for the reset operation as well.

Effects of the embodiment will now be described.

In the embodiment, by collecting the word lines WL into the three systems, the memory cell structure body MAT in which only the intermediate potential is applied can be disposed between the memory cell structure bodies MAT including the selected cells. Thereby, the memory cell structure body MAT in which only the intermediate potential is applied functions as a shield; and the operations of the memory cells can be stabilized even more.

Although examples are shown in the first and second embodiments described above in which the word lines WL are bundled into two systems or three systems, this is not limited thereto; and the bundling may be into four systems or more. Also, even in the case where the bundling is into three systems, the bundling method is arbitrary. Thereby, the degrees of freedom when applying the potential in each of the memory cell structure bodies MAT improve; and various driving is possible. As a result, the stress occurring between the memory cell structure bodies MAT can be controlled without making the driving method excessively complex and without reducing the drive speed.

Third Embodiment

A third embodiment will now be described.

The embodiment is an embodiment of a method for manufacturing the memory device. The memory device that is manufactured in the embodiment is intrinsically the same as the memory devices according to the first and second embodiments described above but also has slightly different portions. For example, in the embodiment, the word line WL is formed in the lowermost layer; and the memory cell structure body MAT is formed of two layers of the bit lines BL and the word lines WL between the two layers of the bit lines BL.

FIG. 13A to FIG. 17B are cross-sectional views showing the method for manufacturing the memory device according to the embodiment.

FIG. 13A and FIG. 13B show the same process; FIG. 13A shows the XZ cross section; and FIG. 13B shows the YZ cross section. This is similar for FIG. 14A to FIG. 17B as well.

First, the silicon substrate 11 is prepared as shown in FIG. 13 and FIG. 13B. Then, the drive circuit 13 is formed on the upper layer portion and the upper surface of the silicon substrate 11. Then, the inter-layer insulating film 12 is formed on the silicon substrate 11 to bury the drive circuit 13.

Then, a barrier metal layer 20 is formed on the inter-layer insulating film 12 by depositing, for example, tungsten nitride (WN), titanium nitride, or titanium. Then, the word line WL of the lowermost layer is formed by depositing, for example, tungsten (W).

Then, the barrier metal layer 21 is formed. Then, the high resistance layer 22 is formed by depositing, for example, titanium silicate nitride (TiSiN) or tantalum silicate nitride (TaSiN). Then, the ion-movement layer 23 is formed by depositing, for example, silicon (Si) or silicon oxide (SiO). Then, the metal layer 24 is formed by depositing, for example, silver (Ag). Then, the barrier metal layer 25 is formed by depositing, for example, tungsten nitride (WN), titanium nitride, or titanium. Then, an electrode film 28 is formed by depositing, for example, tungsten. Then, a liner film 30 is formed by thinly depositing, for example, silicon nitride on the entire surface.

Then, the stacked body from the barrier metal layer 20 to the liner film 30 is divided into a line-and-space configuration extending in the Y-direction by lithography and RIE (Reactive Ion Etching). Then, the inter-layer insulating film 29 is deposited; and planarization by CMP (Chemical Mechanical Polishing) or the like is performed using the electrode film 28 as a stopper.

Figures 14A, 14B:
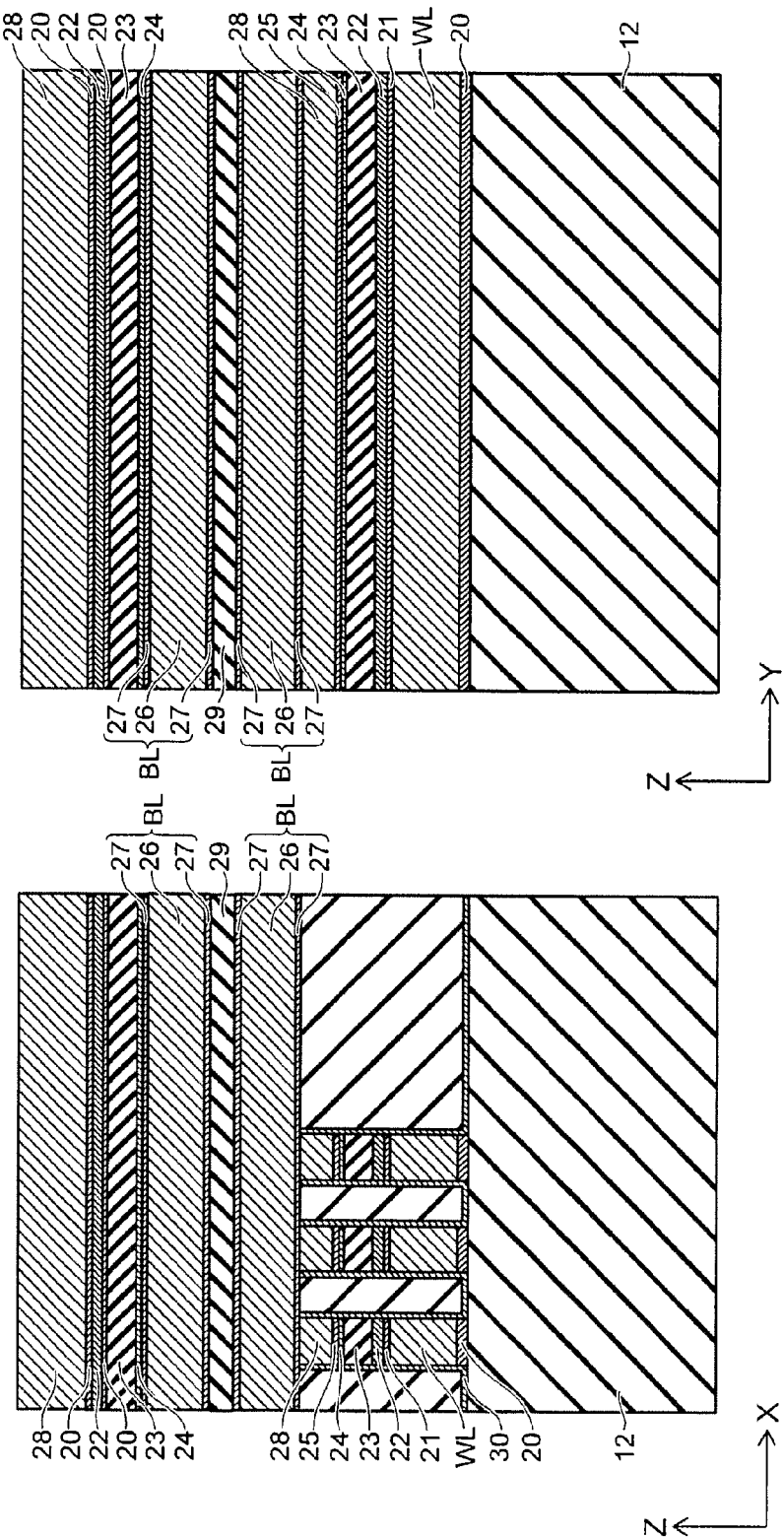

Then, as shown in FIG. 14A and FIG. 14B, the bit line BL on the lower layer side is formed by depositing the barrier metal layer 27, the main body unit 26, and the barrier metal layer 27. Then, the inter-layer insulating film 29 is formed. Then, the bit line BL on the upper layer side is formed by depositing the barrier metal layer 27 and the main body unit 26. Then, the barrier metal layer 25, the metal layer 24, the ion-movement layer 23, the barrier metal layer 20, the high resistance layer 22, the barrier metal layer 20, and the electrode film 28 are formed in this order.

Figures 15A, 15B:
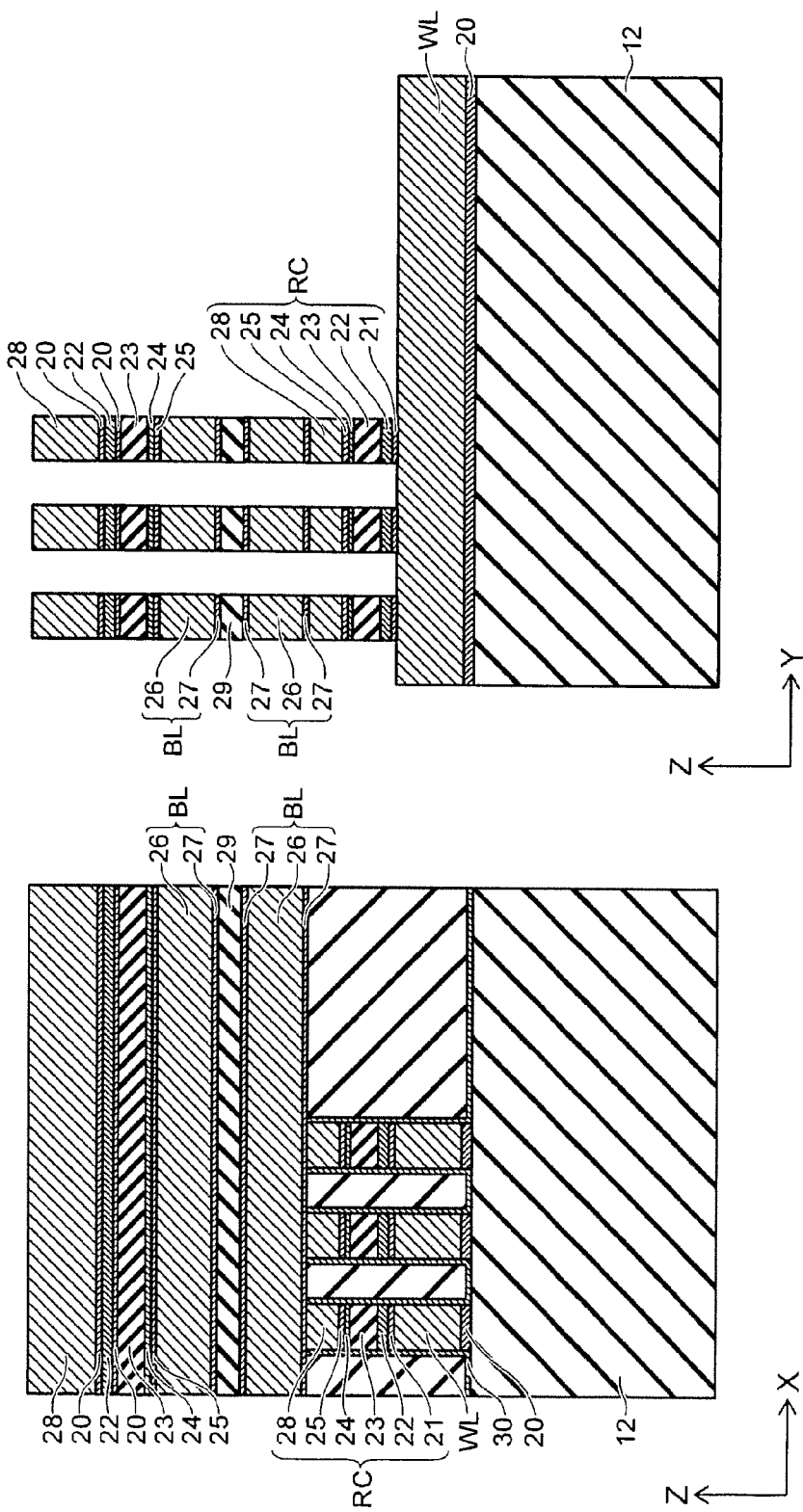

Then, as shown in FIG. 15A and FIG. 15B, the stacked body from the barrier metal layer 21 to the electrode film 28 of the upper layer is divided into a line-and-space configuration extending in the X-direction by lithography and RIE. Thereby, the stacked body from the barrier metal layer 21 to the electrode film 28 of the lower layer is divided into a matrix configuration along the X-direction and the Y-direction to become the variable resistance members RC having substantially quadrilateral prism configurations. Also, the stacked body from the bit line BL of the lower layer to the electrode film 28 of the upper layer is patterned into a line-and-space configuration extending in the X-direction. The word line WL of the lowermost layer remains in the line-and-space configuration extending in the Y-direction.

Figures 16A, 16B:
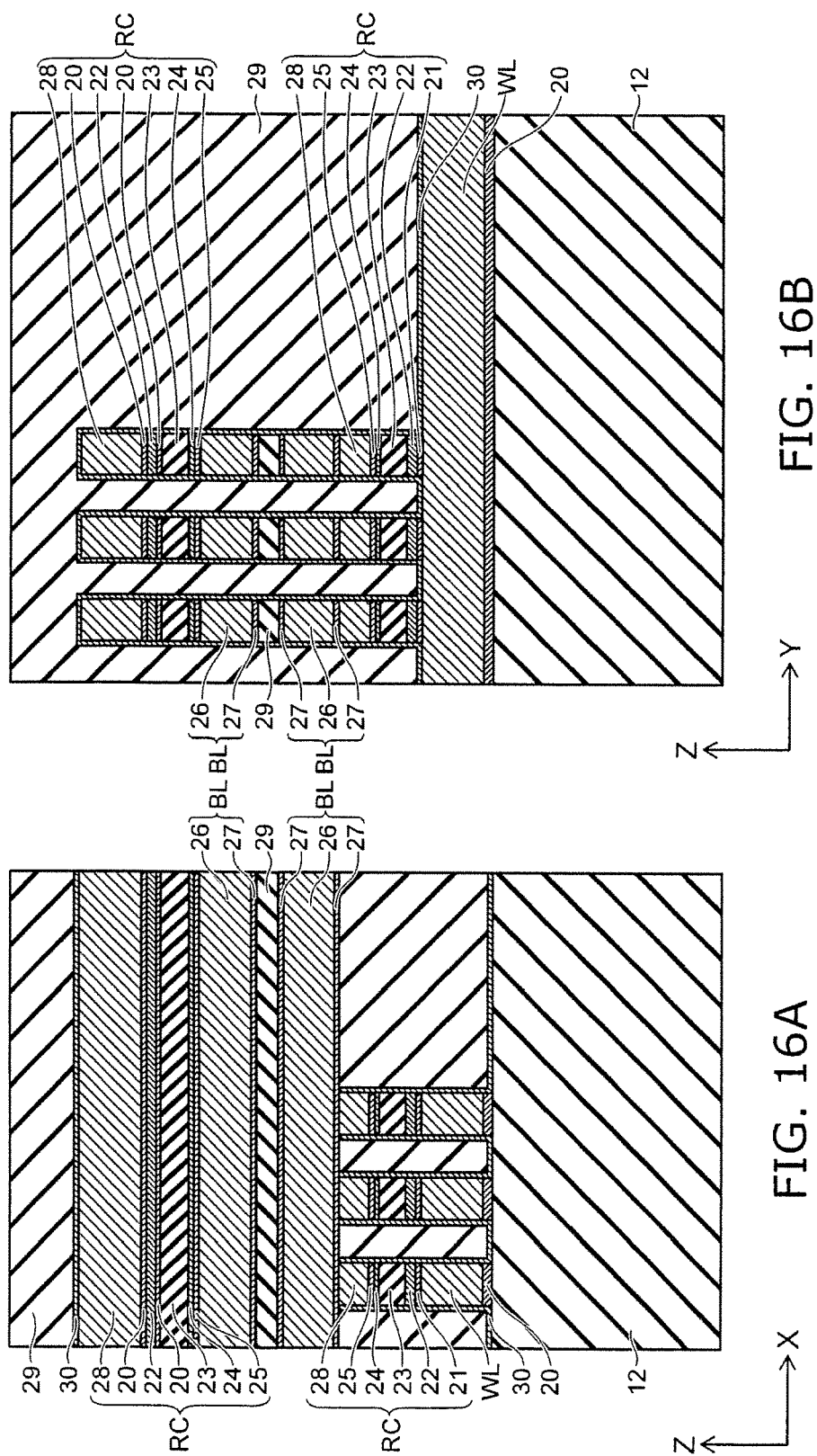

Then, as shown in FIG. 16A and FIG. 16B, the liner film 30 is formed on the entirety; and the entirety is buried in the inter-layer insulating film 29.

Figures 17A, 17B:
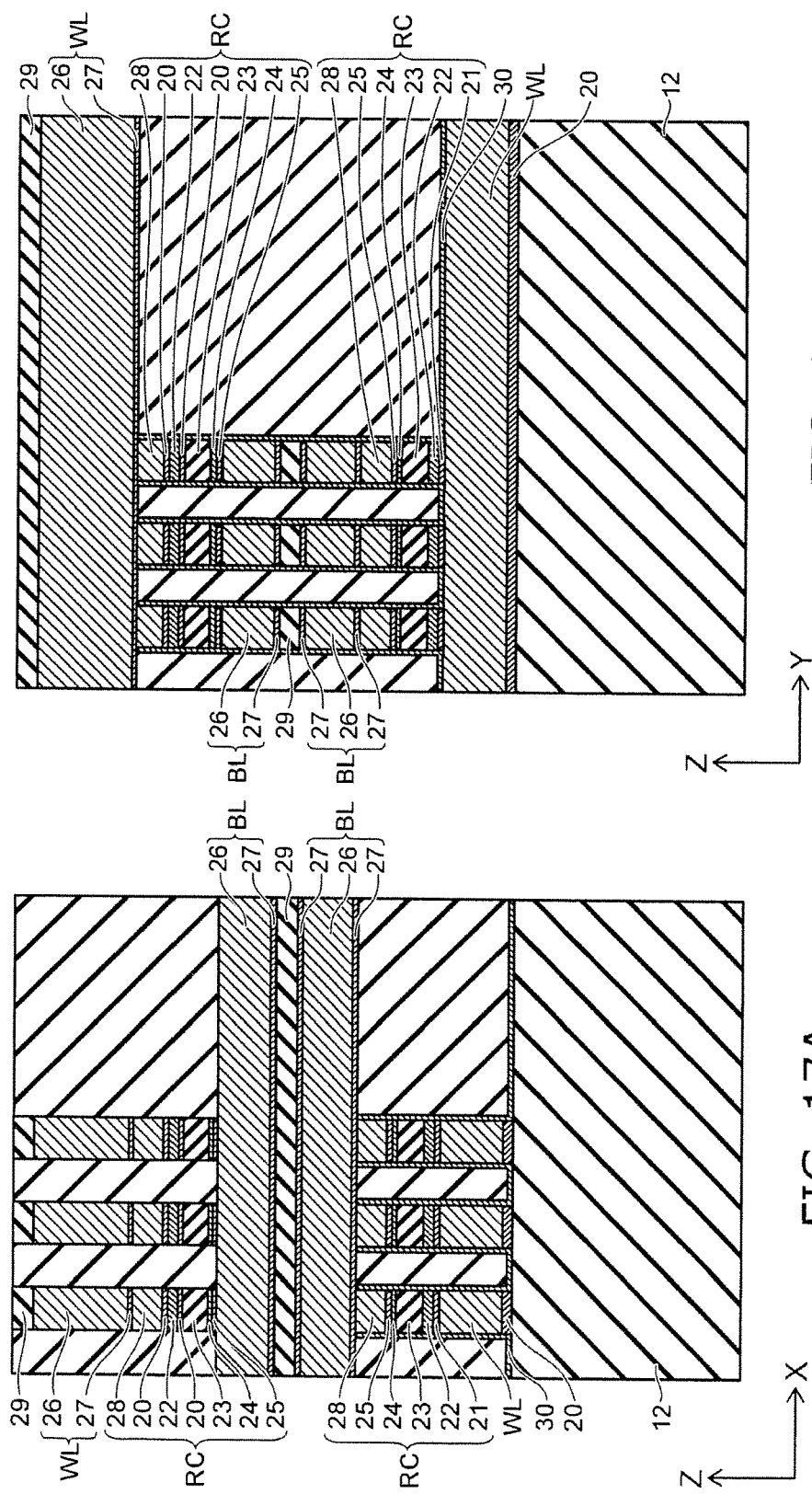

Then, as shown in FIG. 17A and FIG. 17B, planarization such as CMP or the like is performed using the electrode film 28 of the upper layer as a stopper. Then, the barrier metal layer 27 and the main body unit 26 are formed. Thereby, the word line WL of the upper layer is formed. Then, the inter-layer insulating film 29 is formed.

Then, the stacked body from the barrier metal layer 21 on the bit line BL of the upper layer to the inter-layer insulating film 29 of the uppermost layer is patterned into a line-and-space configuration extending in the Y-direction by lithography and RIE. Thereby, the stacked body from the barrier metal layer 21 to the electrode film 28 of the upper layer is divided into a matrix configuration along the X-direction and the Y-direction to become the variable resistance members RC. Also, the word line WL of the upper layer is patterned into a line-and-space configuration extending in the Y-direction.

Similarly thereafter, the memory device according to the embodiment is manufactured by repeatedly implementing the film formation of the films included in the variable resistance member RC, the film formation of the films included in the two layers of the bit lines BL, the patterning into the lines-and-spaces extending in the X-direction, the film formation of the films included in the variable resistance member RC, the film formation of the films included in the word line WL, and the patterning into the lines-and-spaces extending in the Y-direction.

According to the embodiment, memory devices such as those described in the first and second embodiments described above can be manufactured efficiently.

According to the embodiments described above, a memory device that has stable operations can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A memory device, comprising:
a substrate;
a first interconnect extending in a first direction, the first direction being parallel to a major surface of the substrate;
a second interconnect extending in a second direction, the second direction crossing the first direction and being parallel to the major surface of the substrate;
a first variable resistance member connected between the first interconnect and the second interconnect;
a third interconnect extending in the first direction;
a second variable resistance member connected between the second interconnect and the third interconnect;
a fourth interconnect extending in the first direction being insulated from the third interconnect;
a fifth interconnect extending in the second direction;
a third variable resistance member connected between the fourth interconnect and the fifth interconnect,
the first interconnect, the second interconnect, the third interconnect, the fourth interconnect and the fifth interconnect being arranged along a third-direction in this order, and the third direction crossing the first direction and the second direction,
each of the first variable resistance member, the second variable resistance member and the third variable resistance member including Tellurium;
a sixth interconnect extending in the first direction;
a fourth variable resistance member connected between the fifth interconnect and the sixth interconnect,
the first interconnect, the second interconnect, the third interconnect, the fourth interconnect, the fifth interconnect and the sixth interconnect being arranged along the third-direction in this order;
a seventh interconnect extending in the first direction, being insulated from the sixth interconnect;
an eighth interconnect extending in the second direction;
a ninth interconnect extending in the first direction;
a fifth variable resistance member connected between the seventh interconnect and the eighth interconnect;
a sixth variable resistance member connected between the eighth interconnect and the ninth interconnect,
the first interconnect, the second interconnect, the third interconnect, the fourth interconnect, the fifth interconnect, the sixth interconnect, the seventh interconnect, the eighth interconnect and the ninth interconnect being arranged along the third-direction in this order;
an end portion of the first interconnect is connected to an end portion of the fourth interconnect,
an end portion of the third interconnect is connected to an end portion of the seventh interconnect, and
an end portion of the sixth interconnect is connected to an end portion of the ninth interconnect; and
a drive circuit applying a first potential to the third interconnect and the seventh interconnect and applying a second potential to the second interconnect and the eighth interconnect,
wherein the drive circuit applies a third potential to the fourth interconnect, the fifth interconnect, and the sixth interconnect, the third potential being between the first potential and the second potential.

2. The memory device according to claim 1, wherein the drive circuit applies the third potential to the first interconnect and the ninth interconnect.

3. The memory device according to claim 1, wherein the first variable resistance member includes:
a metal layer including a metal; and
an ion-movement layer, ions of the metal being able to move in the ion-movement layer, a resistivity of the ion-movement layer being higher than a resistivity of the metal layer.

4. The memory device according to claim 3, wherein the metal further includes at least one type of metal selected from the group consisting of gold, silver, copper, platinum, palladium, titanium, iron, chrome, cobalt, nickel, aluminum, indium, sodium, and calcium.

5. The memory device according to claim 1, wherein the first variable resistance member and the second variable resistance member each include:
a metal layer including a metal; and
an ion-movement layer, ions of the metal being able to move in the ion-movement layer, a resistivity of the ion-movement layer being higher than a resistivity of the metal layer, and
an arrangement order along the third direction of the metal layer and the ion-movement layer in the first variable resistance member is the reverse of an arrangement order along the third direction of the metal layer and the ion-movement layer in the second variable resistance member.

6. A memory device, comprising:
a substrate;
a plurality of memory cell structure bodies arranged along a first direction, the substrate and the plurality of memory cell structure bodies being arranged along the first direction, the first direction crossing a major surface of the substrate,
each of the memory cell structure bodies including:
a first interconnect layer;
a second interconnect layer;
a third interconnect layer disposed between the first interconnect layer and the second interconnect layer;

a first variable resistance member layer disposed between the first interconnect layer and the third interconnect layer; and a second variable resistance member layer disposed between the second interconnect layer and the third interconnect layer; and a drive circuit, the first interconnect layer, the third interconnect layer, and the second interconnect layer being arranged along the first direction in this order, the first interconnect layer including a plurality of first interconnects extending in a second direction, the second direction being parallel to the major surface of the substrate, the second interconnect layer including a plurality of second interconnects extending in the second direction, the third interconnect layer having a plurality of third interconnects extending in a third direction, the third direction being parallel to the major surface of the substrate and crossing the second direction, the first variable resistance member layer including first variable resistance members connected between the first interconnects and the third interconnects, the second variable resistance member layer including second variable resistance members connected between the second interconnects and the third interconnects, each of the first variable resistance members and the second variable resistance members including Tellurium, a first memory cell structure body of the memory cell structure bodies, a second memory cell structure body of the memory cell structure bodies, and a third memory cell structure body of the memory cell structure bodies being arranged in this order, the second interconnect of the first memory cell structure body and the first interconnect of the second memory cell structure body being insulated from each other, the second interconnect of the second memory cell structure body and the first interconnect of the third memory cell structure body being insulated from each other, and the drive circuit applying a first potential to the second interconnect of the first memory cell structure body and the first interconnect of the third memory cell structure body, applying a second potential to the third interconnect of the first memory cell structure body and the third interconnect of the third memory cell structure body, and applying a third potential to the first interconnect of the second memory cell structure body, the second interconnect of the second memory cell structure body and the third interconnect of the second memory cell structure body, the third potential being between the first potential and the second potential.

7. A memory device, comprising:
a substrate;
a first interconnection extending in a first direction parallel to the substrate;
a second interconnection extending in a second direction crossing the first direction, the second direction being parallel to the substrate;
a third interconnection being adjacent to the second interconnection in a third direction, the third interconnection extending in the second direction, the third direction perpendicular to the first direction and the second direction;
a fourth interconnection extending in the first direction, the third interconnection being provided between the second interconnection and the fourth interconnection;
a first variable resistance member connected between the first interconnection and the second interconnection; and
a second variable resistance member connected between the third interconnection and the fourth interconnection,
wherein a variable resistance member is not provided between the substrate and the first interconnection,
wherein a variable resistance member is not provided between the second interconnection and the third interconnection.

8. The device according to claim 7, wherein the second interconnection is separated from the third interconnection in the third direction.

9. The device according to claim 8, further comprising an insulating film provided between the second interconnection and the part of the third interconnection.

10. The device according to claim 7, wherein
a first distance between the substrate and the first interconnection is shorter than a second distance between the substrate and the second interconnection,
the first distance is shorter than a third distance between the substrate and the third interconnection, and
the first distance is shorter than a fourth distance between the substrate and the fourth interconnection.

11. The device according to claim 10, wherein the third distance is shorter than the fourth distance.

12. The device according to claim 7, wherein the second interconnection and the third interconnection are formed at different timings.

13. The device according to claim 7, wherein an interconnection is not provided between the second interconnection and the third interconnection.

14. The device according to claim 7, wherein each of the first variable resistance member and the second variable resistance member includes a layer including Tellurium.

15. A memory device, comprising:
a substrate;
a first wiring layer extending in a first direction parallel to the substrate;
a second wiring layer extending in a second direction crossing the first direction, the second direction being parallel to the substrate;
a third wiring layer being adjacent to the second wiring layer in a third direction, the third wiring layer extending in the second direction, the third direction being perpendicular to the first direction and the second direction;
a fourth wiring layer extending in the first direction;
a first variable resistance member connected between the first wiring layer and the second wiring layer; and
a second variable resistance member connected between the third wiring layer and the fourth wiring layer,
wherein a variable resistance member is not provided between the substrate and the first wiring layer, and
a first distance between the substrate and the third wiring layer is shorter than a second distance between the substrate and the fourth wiring layer,
wherein a variable resistance member is not provided between the second wiring layer and the third wiring layer.

16. The device according to claim 15, wherein the second wiring layer is separated from a part of the third wiring layer in the third direction.

17. The device according to claim 16, further comprising an insulating film provided between the second wiring layer and the part of the third wiring layer.

18. The device according to claim 15, wherein
a third distance between the substrate and the first wiring layer is shorter than a fourth distance between the substrate and the second wiring layer,
the third distance is shorter than the first distance, and
the third distance is shorter than the second distance.

19. The device according to claim 15, wherein the second wiring layer and the third wiring layer are formed at different timings.

20. The device according to claim 15, wherein a wiring layer is not provided between the second wiring layer and the third wiring layer.

21. The device according to claim 15, wherein the second wiring layer and third wiring layer is provided between the first wiring layer and the fourth wiring layer.

22. The device according to claim 15, wherein each of the first variable resistance member and the second variable resistance member includes a layer including Tellurium.

* * * * *